US011921427B2

(12) United States Patent
Weidman et al.

(10) Patent No.: US 11,921,427 B2
(45) Date of Patent: Mar. 5, 2024

(54) METHODS FOR MAKING HARD MASKS USEFUL IN NEXT-GENERATION LITHOGRAPHY

(71) Applicant: Lam Research Corporation, Fremont, CA (US)

(72) Inventors: Timothy William Weidman, Sunnyvale, CA (US); Katie Nardi, San Jose, CA (US); Chenghao Wu, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 372 days.

(21) Appl. No.: 17/309,247

(22) PCT Filed: Nov. 11, 2019

(86) PCT No.: PCT/US2019/060742
§ 371 (c)(1),
(2) Date: May 11, 2021

(87) PCT Pub. No.: WO2020/102085
PCT Pub. Date: May 22, 2020

(65) Prior Publication Data
US 2021/0397085 A1 Dec. 23, 2021

Related U.S. Application Data

(60) Provisional application No. 62/767,198, filed on Nov. 14, 2018.

(51) Int. Cl.
*G03F 7/20* (2006.01)
*G03F 7/32* (2006.01)
*G03F 7/004* (2006.01)

(52) U.S. Cl.
CPC ........... *G03F 7/2004* (2013.01); *G03F 7/327* (2013.01); *G03F 7/0042* (2013.01)

(58) Field of Classification Search
CPC ....... G03F 7/0042; G03F 7/2004; G03F 7/327
See application file for complete search history.

(56) References Cited

U.S. PATENT DOCUMENTS

| | | |
|---|---|---|
| 3,442,648 A | 5/1969 | Smith et al. |
| 3,513,010 A | 5/1970 | Notley |
| 3,529,963 A | 9/1970 | Marchese |
| 3,576,755 A | 4/1971 | Patella et al. |
| 3,720,515 A | 3/1973 | Stanley |
| 4,241,165 A | 12/1980 | Hughes et al. |
| 4,292,384 A | 9/1981 | Straughan et al. |
| 4,328,298 A | 5/1982 | Nester |
| 4,341,592 A | 7/1982 | Shortes et al. |
| 4,396,704 A | 8/1983 | Taylor |
| 4,590,149 A | 5/1986 | Nakane et al. |
| 4,738,748 A | 4/1988 | Kisa |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |
| 5,077,085 A | 12/1991 | Schnur et al. |
| 5,322,765 A | 6/1994 | Clecak et al. |
| 5,399,464 A | 3/1995 | Lee |
| 5,445,988 A | 8/1995 | Schwalke |
| 5,534,312 A | 7/1996 | Hill et al. |
| 5,914,278 A | 6/1999 | Boitnott et al. |
| 5,925,494 A | 7/1999 | Horn |
| 6,017,553 A | 1/2000 | Burrell et al. |
| 6,162,577 A | 12/2000 | Felter et al. |
| 6,179,922 B1 | 1/2001 | Ishikawa et al. |
| 6,261,938 B1 | 7/2001 | Beauvais et al. |
| 6,290,779 B1 | 9/2001 | Saleh et al. |
| 6,313,035 B1 | 11/2001 | Sandhu et al. |
| 6,319,654 B1 | 11/2001 | Kim et al. |
| 6,348,239 B1 | 2/2002 | Hill et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,797,439 B1 | 9/2004 | Alpay |
| 6,833,306 B2 | 12/2004 | Lyding et al. |
| 6,841,341 B2 | 1/2005 | Fairbairn et al. |
| 6,841,943 B2 | 1/2005 | Vahedi et al. |
| 7,169,440 B2 | 1/2007 | Balasubramaniam et al. |
| 7,223,526 B2 | 5/2007 | Fairbairn et al. |
| 7,335,462 B2 | 2/2008 | Fairbairn et al. |
| 7,608,367 B1 | 10/2009 | Aigeldinger et al. |
| 8,465,903 B2 | 6/2013 | Weidman et al. |
| 8,536,068 B2 | 9/2013 | Weidman et al. |

(Continued)

FOREIGN PATENT DOCUMENTS

| | | |
|---|---|---|
| CN | 102610516 A | 7/2012 |
| CN | 103119695 A | 5/2013 |

(Continued)

OTHER PUBLICATIONS

Notice of Allowance dated Aug. 22, 2017 issued in U.S. Appl. No. 14/610,038.
Final Office Action dated May 11, 2017 issued in U.S. Appl. No. 14/610,038.
Office Action dated Jan. 23, 2017 issued in U.S. Appl. No. 14/610,038.
Office Action dated May 21, 2018 issued in U.S. Appl. No. 15/691,659.
Final Office Action dated Sep. 10, 2018 issued in U.S. Appl. No. 15/691,659.
Office Action dated Apr. 9, 2019 issued in U.S. Appl. No. 15/691,659.
Notice of Allowance dated Sep. 19, 2019 issued in U.S. Appl. No. 15/691,659.
U.S. Office Action, dated Mar. 5, 2020, issued in U.S. Appl. No. 16/206,959.

(Continued)

*Primary Examiner* — Christopher G Young
(74) *Attorney, Agent, or Firm* — Weaver Austin Villeneuve & Sampson LLP

(57) ABSTRACT

Imaging layers on the surface of a substrate may be patterned using next generation lithographic techniques, and the resulting patterned film may be used as a lithographic mask, for example, for production of a semiconductor device.

42 Claims, 14 Drawing Sheets

(56) References Cited

U.S. PATENT DOCUMENTS

| | | |
|---|---|---|
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,261,784 B2 | 2/2016 | Wuister et al. |
| 9,281,207 B2 | 3/2016 | Stowers et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,719,169 B2 | 8/2017 | Mohn et al. |
| 9,778,561 B2 | 10/2017 | Marks et al. |
| 9,823,564 B2 | 11/2017 | Stowers et al. |
| 9,829,805 B2 | 11/2017 | Michaelson et al. |
| 9,996,004 B2 | 6/2018 | Smith et al. |
| 10,025,179 B2 | 7/2018 | Meyers et al. |
| 10,228,618 B2 | 3/2019 | Meyers et al. |
| 10,416,554 B2 | 9/2019 | Meyers et al. |
| 10,514,598 B2 | 12/2019 | Marks et al. |
| 10,566,212 B2 | 2/2020 | Kanarik |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,763,083 B2 | 9/2020 | Yang et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 2001/0024769 A1 | 9/2001 | Donoghue et al. |
| 2001/0055731 A1 | 12/2001 | Irie |
| 2002/0017243 A1 | 2/2002 | Pyo |
| 2002/0180372 A1 | 12/2002 | Yamazaki |
| 2002/0185067 A1 | 12/2002 | Upham |
| 2003/0008246 A1 | 1/2003 | Cheng et al. |
| 2003/0183244 A1 | 10/2003 | Rossman |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0203256 A1 | 10/2004 | Yang et al. |
| 2004/0213563 A1 | 10/2004 | Irie |
| 2004/0233401 A1 | 11/2004 | Irie |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2005/0257747 A1 | 11/2005 | Wakabayashi et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0246713 A1 | 11/2006 | Tsai et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0259492 A1 | 11/2007 | Roh, II et al. |
| 2007/0287073 A1 | 12/2007 | Goodwin |
| 2008/0070128 A1 | 3/2008 | Wu et al. |
| 2008/0157011 A1 | 7/2008 | Nagai et al. |
| 2009/0134119 A1 | 5/2009 | Matsumaru et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0009274 A1 | 1/2010 | Yamamoto |
| 2010/0022078 A1 | 1/2010 | Rockenberger et al. |
| 2010/0086880 A1 | 4/2010 | Saito et al. |
| 2010/0131093 A1 | 5/2010 | Yokoyama et al. |
| 2010/0197135 A1 | 8/2010 | Ishizaka |
| 2010/0260994 A1 | 10/2010 | Groenen et al. |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0104595 A1 | 5/2011 | Hayashi et al. |
| 2011/0195142 A1 | 8/2011 | Mitamura et al. |
| 2011/0198756 A1 | 8/2011 | Thenappan et al. |
| 2011/0209725 A1 | 9/2011 | Kim et al. |
| 2011/0244680 A1 | 10/2011 | Tohnoe et al. |
| 2011/0292356 A1 | 12/2011 | Tsukinoki et al. |
| 2012/0024388 A1 | 2/2012 | Burrows et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0183689 A1 | 7/2012 | Suzuki et al. |
| 2012/0193762 A1 | 8/2012 | Lin et al. |
| 2012/0202357 A1 | 8/2012 | Sato et al. |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0129995 A1 | 5/2013 | Outtara et al. |
| 2013/0157177 A1 | 6/2013 | Yu et al. |
| 2013/0164691 A1 | 6/2013 | Shiobara |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0273733 A1 | 10/2013 | Tang et al. |
| 2013/0299089 A1 | 11/2013 | Kim et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0263172 A1 | 9/2014 | Xie et al. |
| 2014/0268082 A1 | 9/2014 | Michaelson et al. |
| 2014/0272726 A1 | 9/2014 | Chang |
| 2015/0020848 A1 | 1/2015 | Kim et al. |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0125679 A1 | 5/2015 | Ishikawa et al. |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0218695 A1 | 8/2015 | Odedra |
| 2015/0221519 A1 | 8/2015 | Marks et al. |
| 2015/0243520 A1 | 8/2015 | Park et al. |
| 2015/0303064 A1 | 10/2015 | Singer et al. |
| 2015/0332922 A1 | 11/2015 | Chien et al. |
| 2015/0355549 A1 | 12/2015 | Xie et al. |
| 2016/0011505 A1 | 1/2016 | Stowers et al. |
| 2016/0011516 A1 | 1/2016 | deVilliers |

(56) References Cited

U.S. PATENT DOCUMENTS

| | | |
|---|---|---|
| 2016/0035631 A1 | 2/2016 | Lee et al. |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0357103 A1 | 12/2016 | Nagahara et al. |
| 2016/0357107 A1 | 12/2016 | Buchberger, Jr. et al. |
| 2016/0365248 A1 | 12/2016 | Mebarki et al. |
| 2016/0379824 A1 | 12/2016 | Wise et al. |
| 2017/0010535 A1 | 1/2017 | Fujitani et al. |
| 2017/0069462 A1 | 3/2017 | Kanarik et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0261850 A1 | 9/2017 | Stowers et al. |
| 2017/0342553 A1 | 11/2017 | Yu et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0122648 A1 | 5/2018 | Kim et al. |
| 2018/0151350 A1 | 5/2018 | Li |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1 | 8/2018 | Glodde et al. |
| 2018/0233398 A1 | 8/2018 | Van Cleemput et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0323064 A1 | 11/2018 | Jung et al. |
| 2018/0337046 A1 | 11/2018 | Shamma et al. |
| 2018/0354804 A1 | 12/2018 | Venkatasubramanian et al. |
| 2018/0356731 A1 | 12/2018 | Tagawa |
| 2019/0027357 A1 | 1/2019 | Girard et al. |
| 2019/0041755 A1 | 2/2019 | Tanaka et al. |
| 2019/0043731 A1 | 2/2019 | Bristol et al. |
| 2019/0094685 A1 | 3/2019 | Marks et al. |
| 2019/0129307 A1 | 5/2019 | Kwon et al. |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0352776 A1 | 11/2019 | Parikh |
| 2019/0369489 A1 | 12/2019 | Meyers et al. |
| 2019/0391486 A1 | 12/2019 | Jiang et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133131 A1 | 4/2020 | Ouyang |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1 | 1/2021 | Wu et al. |
| 2021/0271170 A1 | 9/2021 | Telecky et al. |
| 2021/0302833 A1 | 9/2021 | Weng et al. |
| 2021/0305040 A1 | 9/2021 | Kuo et al. |
| 2022/0020584 A1 | 1/2022 | Volosskiy et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2023/0031955 A1 | 2/2023 | Yu et al. |
| 2023/0045336 A1 | 2/2023 | Yu et al. |
| 2023/0107357 A1 | 4/2023 | Dictus et al. |
| 2023/0152701 A1 | 5/2023 | Kanakasabapathy |
| 2023/0230811 A1 | 7/2023 | Yu et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0290657 A1 | 9/2023 | Yu et al. |
| 2023/0314946 A1 | 10/2023 | Hansen et al. |
| 2023/0314954 A1 | 10/2023 | Peter et al. |

FOREIGN PATENT DOCUMENTS

| | | |
|---|---|---|
| CN | 103243310 A | 8/2013 |
| CN | 105579906 A | 5/2016 |
| CN | 106876251 A | 6/2017 |
| CN | 108351594 A | 7/2018 |
| CN | 108388079 A | 8/2018 |
| CN | 109521657 A | 3/2019 |
| CN | 109976097 A | 7/2019 |
| CN | 111258190 A | 6/2020 |
| EP | 0465064 A2 | 1/1992 |
| EP | 1123423 B1 | 8/2007 |
| EP | 2608247 A1 | 6/2013 |
| EP | 3230294 A1 | 10/2017 |
| EP | 3258317 A1 | 12/2017 |
| JP | S5119974 A | 2/1976 |
| JP | S57205736 A | 12/1982 |
| JP | S58108744 A | 6/1983 |
| JP | S6112653 U | 1/1986 |
| JP | H04226462 A | 8/1992 |
| JP | H0637050 A | 2/1994 |
| JP | H06169021 A | 6/1994 |
| JP | H06232041 A | 8/1994 |
| JP | 07-106224 A | 4/1995 |
| JP | H0869959 A | 3/1996 |
| JP | H08316237 A | 11/1996 |
| JP | H08339950 A | 12/1996 |
| JP | H1041206 A | 2/1998 |
| JP | H10209133 A | 8/1998 |
| JP | 2000305273 A | 11/2000 |
| JP | 2000347413 A | 12/2000 |
| JP | 2002100558 A | 4/2002 |
| JP | 2003-213001 A | 7/2003 |
| JP | 2003-532303 A | 10/2003 |
| JP | 2004-006798 A | 1/2004 |
| JP | 2004513515 A | 4/2004 |
| JP | 2004259786 A | 9/2004 |

(56) References Cited

FOREIGN PATENT DOCUMENTS

| | | |
|---|---|---|
| JP | 2005-504146 A | 2/2005 |
| JP | 2005260015 A | 9/2005 |
| JP | 2006-253282 A | 9/2006 |
| JP | 2006310681 A | 11/2006 |
| JP | 2007027617 A | 2/2007 |
| JP | 2008091215 A | 4/2008 |
| JP | 2009192350 A | 8/2009 |
| JP | 2009212404 A | 9/2009 |
| JP | 2010016083 A | 1/2010 |
| JP | 2010016314 A | 1/2010 |
| JP | 2010531931 A | 9/2010 |
| JP | 2010239087 A | 10/2010 |
| JP | 2011-520242 A | 7/2011 |
| JP | 2011-529126 A | 12/2011 |
| JP | 2012142481 A | 7/2012 |
| JP | 2012-185485 A | 9/2012 |
| JP | 2012173315 A | 9/2012 |
| JP | 5055743 B2 | 10/2012 |
| JP | 2013033291 A | 2/2013 |
| JP | 2013047848 A | 3/2013 |
| JP | 2013096011 A | 5/2013 |
| JP | 2013526061 A | 6/2013 |
| JP | 2013145874 A | 7/2013 |
| JP | 2013151627 A | 8/2013 |
| JP | 5544914 B2 | 7/2014 |
| JP | 2014-521111 A | 8/2014 |
| JP | 5705103 B2 | 4/2015 |
| JP | 2015-201622 A | 11/2015 |
| JP | 2016517633 A | 6/2016 |
| JP | 2016131238 A | 7/2016 |
| JP | 2016208027 A | 12/2016 |
| JP | 2017045869 A | 3/2017 |
| JP | 2017108053 A | 6/2017 |
| JP | 2017116923 A | 6/2017 |
| JP | 2018006742 A | 1/2018 |
| JP | 2018502173 A | 1/2018 |
| JP | 2018025686 A | 2/2018 |
| JP | 2018518688 A | 7/2018 |
| JP | 2018164076 A | 10/2018 |
| JP | 2019500490 A | 1/2019 |
| JP | 2019506730 A | 3/2019 |
| JP | 2019053305 A | 4/2019 |
| JP | 2019056730 A | 4/2019 |
| JP | 2019135755 A | 8/2019 |
| JP | 2019192814 A | 10/2019 |
| JP | 2021523403 A | 9/2021 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 20070003657 A | 1/2007 |
| KR | 100841495 B1 | 6/2008 |
| KR | 2009-0042059 A | 4/2009 |
| KR | 20110007192 A | 1/2011 |
| KR | 2013/0093038 A | 8/2013 |
| KR | 101426105 B1 | 8/2014 |
| KR | 20140106442 A | 9/2014 |
| KR | 20150091260 A | 8/2015 |
| KR | 20150127145 A | 11/2015 |
| KR | 20160035995 A | 4/2016 |
| KR | 20170066218 A | 6/2017 |
| KR | 20170066225 A | 6/2017 |
| KR | 20180036263 A | 4/2018 |
| KR | 20180054917 A | 5/2018 |
| KR | 20180116438 A | 10/2018 |
| KR | 20190085654 A | 7/2019 |
| KR | 20190139594 A | 12/2019 |
| TW | 1365354 B | 6/2012 |
| TW | 201224190 A | 6/2012 |
| TW | 201241555 A1 | 10/2012 |
| TW | 1494689 B | 8/2015 |
| TW | 201729006 A | 8/2017 |
| TW | 201734025 A | 10/2017 |
| TW | 201837066 A | 10/2018 |
| WO | WO 03/029015 A2 | 4/2003 |
| WO | WO 2004/095551 A1 | 11/2004 |
| WO | WO-2007123539 A1 | 11/2007 |
| WO | WO-2008088076 A1 | 7/2008 |
| WO | WO 2011/081151 A1 | 7/2011 |
| WO | WO-2011137059 A2 | 11/2011 |
| WO | WO 2012/048094 A3 | 4/2012 |
| WO | WO-2013007442 A1 | 1/2013 |
| WO | WO 2014/152023 A1 | 9/2014 |
| WO | WO-2016065120 A1 | 4/2016 |
| WO | WO 2016/144960 A1 | 9/2016 |
| WO | WO 2017/066319 A2 | 4/2017 |
| WO | WO-2017109040 A1 | 6/2017 |
| WO | WO-2017153725 A1 | 9/2017 |
| WO | WO 2017/198418 A1 | 11/2017 |
| WO | WO 2018/004551 A1 | 1/2018 |
| WO | WO-2018004646 A1 | 1/2018 |
| WO | WO-2018061670 A1 | 4/2018 |
| WO | WO-2018173446 A1 | 9/2018 |
| WO | WO-2019023797 A1 | 2/2019 |
| WO | WO-2019163455 A1 | 8/2019 |
| WO | WO 2019/217749 A1 | 9/2019 |
| WO | WO-2019222320 A1 | 11/2019 |
| WO | WO-2019230462 A1 | 12/2019 |
| WO | WO-2019241402 A1 | 12/2019 |
| WO | WO-2020030855 A2 | 2/2020 |
| WO | WO-2020033602 A1 | 2/2020 |
| WO | WO-2020050035 A1 | 3/2020 |
| WO | WO 2020/102085 A1 | 5/2020 |
| WO | WO-2020132281 A1 | 6/2020 |
| WO | WO-2020190941 A1 | 9/2020 |
| WO | WO-2020223011 A1 | 11/2020 |
| WO | WO-2020223152 A1 | 11/2020 |
| WO | WO2020/263750 A1 | 12/2020 |
| WO | WO-2020264158 A1 | 12/2020 |
| WO | WO-2020264557 A1 | 12/2020 |
| WO | WO-2020264571 A1 | 12/2020 |
| WO | WO-2021067632 A2 | 4/2021 |
| WO | WO-2021072042 A1 | 4/2021 |
| WO | WO-2021146138 A1 | 7/2021 |
| WO | WO-2021202681 A1 | 10/2021 |

OTHER PUBLICATIONS

Notice of Allowance, dated Jul. 28, 2020, issued in U.S. Appl. No. 16/206,959.
Office Action, dated May 14, 2021, issued in U.S. Appl. No. 16/691,508.
U.S. Office Action, dated Nov. 2, 2017, issued in U.S. Appl. No. 14/948,109.
U.S. Notice of Allowance, dated Apr. 25, 2018 issued in U.S. Appl. No. 14/948,109.
Japanese First Office Action dated Sep. 15, 2020 issued in Application No. JP 2016-220096.
Japanese Decision to Grant dated May 3, 2021 issued in Application No. JP 2016-220096.
Taiwanese First Office Action dated Aug. 10, 2020 issued in Application No. TW 105137362.
Taiwanese Second Office Action dated Nov. 18, 2020 issued in Application No. TW 105137362.
International Search Report and Written Opinion dated Apr. 24, 2020 issued in Application No. PCT/US2019/067540.
International Preliminary Report on Patentability dated Jul. 1, 2021 issued in Application No. PCT/US2019/067540.
International Search Report and Written Opinion dated Oct. 16, 2020 issued in Application No. PCT/US2020/039615.
International Search Report and Written Opinion dated Oct. 16, 2020 issued in Application No. PCT/US2020/070187.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 8, 2020 issued in Application No. PCT/US2020/038968.
International Search Report and Written Opinion dated Apr. 10, 2020 issued in Application No. PCT/US2019/060742.

(56) References Cited

OTHER PUBLICATIONS

International Preliminary Report on Patentability dated May 27, 2021 issued in Application No. PCT/US2019/060742.
International Search Report and Written Opinion dated Aug. 22, 2019 issued in Application No. PCT/US2019/031618.
International Search Report and Written Opinion dated Mar. 23, 2021 issued in Application No. PCT/US2020/053856.
International Search Report and Written Opinion dated Jan. 27, 2021 issued in Application No. PCT/US2020/054730.
International Search Report and Written Opinion dated May 12, 2021 issued in Application No. PCT/US2021/012953.
International Search Report and Written Opinion dated May 17, 2021 issued in Application No. PCT/US2021/015656.
Chinese First Office Action dated May 24, 2017 issued in Application No. CN 201510053668.7.
Chinese Second Office Action dated Feb. 28, 2018 issued in Application No. CN 201510053668.7.
Japanese First Office Action dated Oct. 30, 2018 issued in Application No. JP 2015-016254.
Japanese Decision to Grant dated Feb. 12, 2019 issued in Application No. JP 2015-016254.
Korean First Office Action dated Dec. 22, 2020 issued in Application No. KR 10-2015-0015184.
Korean Second Office Action dated Jul. 27, 2021 issued in Application No. KR 10-2015-0015184.
Taiwanese First Office Action dated May 31, 2018 issued in Application No. TW 104103153.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.
Gerritsen et al., (Apr. 1, 1986) "Laser-generated plasma as soft x-ray source," J. Appl. Phys., 59(7):2337-2344.
"McGinniss, Vincent D.," "Light Sources," UV Curing: Science and Technology, edited by S. Peter Pappas; Technology Marketing Corporation, 642 Westover Rd., Stamford, CT, USA; (Jan. 1, 1978), pp. 96-129.
Spitzer et al., (Mar. 1, 1986) "Conversion efficiencies from laser-produced plasmas in the extreme ultraviolet regime," J. Appl. Phys., 79(5):2251-2258.
Hench, L.L. And West, J.K., "The sol-gel process", Chemical reviews, Jan. 1, 1990; 90(1) pp. 33-72.
Hamley, I.W., "Nanostructure fabrication using block copolymers", Nanotechnology. Sep. 17, 2003;14(10):R39-R54.
Lu, Y., et al., "Continuous formation of supported cubic and hexagonal mesoporous films by sol-gel dip-coating" Nature, Sep. 1997, 389(6649), pp. 364-368.
Lemaire, P.C., et al., "Understanding inherent substrate selectivity during atomic layer deposition: Effect of surface preparation, hydroxyl density, and metal oxide composition on nucleation mechanisms during tungsten ALD" the Journal of chemical physics, Feb. 7, 2017, 146(5):052811.
Mackus, A.J., et al. "The use of atomic layer deposition in advanced nanopatterning", Nanoscale. Jul. 25, 2014; 6(19):10941-60.
Nazarov, D.V., et al., "Atomic layer deposition of tin dioxide nanofilms: A review", Rev. Adv. Mater. Sci. Jun. 1, 2015; 40(3):262-75.
Kwon, J., et al., "Substrate Selectivity of (tBu-Allyl)Co(CO)3 during Thermal Atomic Layer Deposition of Cobalt" Chemistry of Materials, Mar. 27, 2012; 24(6): pp. 1025-30.
Rantala, et al., "New resist and underlayer approaches toward EUV lithography" Proc. SPIE 10809, International Conference on Extreme Ultraviolet Lithography 2018, pp. 108090X-1-108090X-8. (Oct. 11, 2018). <doi:10.1117/12.2503107>.
Xu, et al., "Underlayer designs to enhance the performance of EUV resists" Proceedings of SPIE, vol. 7273, 2009, pp. 72731J-1-72730-11. <doi:10.1117/12.814223>.
U.S. Appl. No. 17/309,587, filed Jun. 8, 2021, Volosskiy et al.
U.S. Appl. No. 17/310,635, filed Aug. 13, 2021, Tan et al.
Banerjee, D et al., "Potential of Metal-Organic Frameworks for Separation of Xenon and Krypton", Accounts of Chemical Research, 2015, vol. 48, No. 2, pp. 211-219.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Cardineau, B. et al., "EUV Resists Based on Tin-oxo Clusters", Advances in Patterning Materials and Processes XXXI, Proceedings of SPIE, Apr. 4, 2014, vol. 9051, pp. 335-346.
Chiang C L., et al., "Secondary Electron Emission Characteristics of Oxide Electrodes in Flat Electron Emission Lamp," AIP Advances, 2016, vol. 6, 015317, 9 Pages.
CN Office Action dated Jun. 1, 2023, in application No. CN201810783756 with English translation.
CN Office Action dated Jun. 8, 2022 in Application No. CN202180002531.2 With English Translation.
CN Office Action dated Nov. 16, 2022, in Application No. CN202180002531.2 with English translation.
CN Office Action dated Nov. 18, 2022, in Application No. CN201810783756.6 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Jun. 23, 2023, in Application No. EP20831420.3.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
EP Partial European Search Report dated Aug. 29, 2023, in Application No. 23173688.5.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].
Fitzgerald C B., et al., "Magnetism in Dilute Magnetic Oxide Thin Films Based on SnO2," The American Physical Society, 2006, vol. 74, 115307, 10 Pages.
FUJIFILM Corp., (Presentation) "Negative tone development process for double patterning," 5th International Symposium on Immersion Lithography, Sep. 2008, Presentation Slides No. P-1-P-27.
FUJIFILM Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S et al., (Jan. 12, 2017) "New Generation Electron Beam Resists: A Review," Chem. Mater., 29:1898-1917.
Gross, R.A. et al., "Biodegradable Polymers for the Environment", Science, Aug. 2, 2002, vol. 297, No. 5582, pp. 803-807.
Harrisson, S et al., "RAFT Polymerization of Vinyl Esters: Synthesis and Applications", Polymers, 2014, vol. 6, No. 5, pp. 1437-1488.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.

(56) References Cited

OTHER PUBLICATIONS

International Search Report and Written Opinion dated Aug. 4, 2021, in PCT Application No. PCT/US2021/023493.
International Search Report and Written Opinion dated Jul. 13, 2021, in PCT Application No. PCT/US2021/023901.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated May 18, 2022, in International Application No. PCT/US2022/014984.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Aug. 24, 2023, in PCT Application No. PCT/US2022/014984.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Aug. 17, 2023, in Application No. PCT/US2023/019871.
International Search Report and Written Opinion dated Aug. 8, 2018 issued in Application No. PCT/US2018/028192.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Mar. 24, 2022, for International Application No. PCT/US2021/061751.
International Search Report and Written Opinion dated May 3, 2023, in Application No. PCT/US2023/060306.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 16, 2018 issued in Application No. PCT/US2018/032783.
International Search Report and Written Opinion dated Oct. 28, 2021 in PCT Application No. PCT/US2021/040381.
International Search Report and Written Opinion dated Sep. 15, 2021, in PCT Application No. PCT/US2021/034019.
Jalife S., et al., "Noble Gas Endohedral Fullerenes," Chemical Science, 2020, vol. 11, pp. 6642-6652.
Joo, W et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Apr. 11, 2023 in Application No. JP2021-176082 with English translation.
JP Office Action dated Apr. 27, 2023 in Application No. JP2021-575910 with English translation.
JP Office Action dated Feb. 28, 2023 in Application No. JP2020-562160 with English translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 27, 2023, in Application No. JP2022-552422 with English translation.
JP Office Action dated Jun. 27, 2023, in application No. JP2023-63868.
JP Office Action dated Jun. 28, 2022 in Application No. JP2021560945 with English translation.
JP Office Action dated Oct. 3, 2023 in Application No. JP2021-176082 with English Translation.
JP Office Action dated Oct. 10, 2023 in Application No. JP2022-552422 with English Translation.
JP Office Action dated Sep. 19, 2023 in Application No. JP2020-562160 with English translation.
Klepper, K.B et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.

(56) References Cited

OTHER PUBLICATIONS

Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
Korean Decision for Grant dated Sep. 2, 2021 issued in Application No. KR 10-2015-0015184.
KR Office Action dated Feb. 8, 2022, in Application No. KR10-2021-7030794 with English Translation.
KR Office Action dated Aug. 11, 2023, in Application No. KR10-2023-7011840 with English translation.
KR Office Action dated Jan. 2, 2023 in Application No. KR10-2022-7027233 with English translation.
KR Office Action dated May 9, 2022, in Application No. KR1020217030794 with English translation.
KR Office Action dated Sep. 28, 2022, in Application No. KR10-2022-7027233 with English translation.
KR Prior Art Search Report dated Apr. 3, 2023, in application No. KR 10-2022-7029421.
KR Search Report dated Aug. 25, 2023, in Application No. KR10-2021-7022858.
Kvon V., et al., "Secondary Electron Emission of Tin and Tin-Lithium Under Low Energy Helium Plasma Exposure," Nuclear Materials and Energy, 2017, vol. 13, pp. 21-27.
Lin Y., et al., "A New Examination of Secondary Electron Yield Data," Surface and Interface Analysis, 2005, vol. 37, pp. 895-900.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Notice of Allowance dated Dec. 9, 2021 in U.S. Appl. No. 17/310,635.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Saunders M., et al., "Noble Gas Atoms Inside Fullerenes," Science, 1996, vol. 271, pp. 1693-1697.
Singh R., "Unexpected Magnetism In Nanomaterials," Journal of Magnetism and Magnetic Materials, 2013, vol. 346, pp. 58-73.
Stulen, et al., "Extreme Ultraviolet Lithography" IEEE Journal of Quantum Electronics, vol. 35, No. 5, May 1999, pp. 694-699.
Sundberg, P. et al., "Organic and Inorganic-organic Thin Film Structures by Molecular Layer Deposition: A Review", Beilstein Journal of Nanotechnology, 2014, vol. 5, pp. 1104-1136.
Taiwanese Office Action dated Apr. 10, 2023 in TW Application No. TW108140940 with English translation.
Tian Y F., et al., "Oxide Magnetic Semiconductors: Materials, Properties, and Devices," Magnetism, Magnetic Materials, and Interdisciplinary Research, 2013, vol. 22(8), 2 Pages.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Aug. 17, 2023, in application No. TW110124741 with Translation.
TW Office Action dated Jan. 13, 2023, in Application No. TW110124741 with English translation.
TW Office Action dated Jan. 19, 2023 in Application No. TW110141961 with English translation.
TW Office Action dated Jun. 3, 2022, in Application No. TW110143913 with English translation.
TW Office Action dated Mar. 7, 2022, in Application No. TW110101388 with English translation.
TW Office Action dated May 16, 2023, in Application No. TW20190146890 with English translation.
U.S. Final Office Action, dated Feb. 5, 2019 issued in U.S. Appl. No. 15/495,701.
U.S. Final Office Action dated May 12, 2023 in U.S. Appl. No. 17/455,185.
U.S. Non-Final office Action dated Feb. 7, 2023 in U.S. Appl. No. 17/455,185.
U.S. Non-Final Office Action dated May 11, 2023, in U.S. Appl. No. 17/452,365.
U.S. Non-Final Office Action dated Oct. 13, 2023, in U.S. Appl. No. 18/184,545.
U.S. Non-Final Office Action dated Sep. 13, 2023, in U.S. Appl. No. 17/596,651.
U.S. Non-Final Office Action dated Sep. 28, 2023, in U.S. Appl. No. 15/733,598.
U.S. Notice of Allowance dated Aug. 21, 2023 in U.S. Appl. No. 17/452,365.
U.S. Notice of Allowance dated Feb. 22, 2022 in U.S. Appl. No. 17/310,635.
US Notice of Allowance, dated Jun. 10, 2020 issued in U.S. Appl. No. 15/979,340.
U.S. Notice of Allowance dated Sep. 15, 2021, issued in U.S. Appl. No. 16/691,508.
U.S. Notice of Allowance, dated Sep. 30, 2021 issued in U.S. Appl. No. 17/008,095.
U.S. Notice of Allowance dated Sep. 9, 2021, issued in U.S. Appl. No. 16/691,508.
U.S. Office Action, dated Aug. 9, 2018 issued in U.S. Appl. No. 15/495,701.
U.S. Office Action, dated Mar. 18, 2021 issued in U.S. Appl. No. 17/008,095.
U.S. Office Action, dated Nov. 6, 2019 issued in U.S. Appl. No. 15/979,340.
U.S. Appl. No. 17/759,896, inventors Nagabhirava et al., filed Aug. 1, 2022.
U.S. Appl. No. 17/905,754, inventors Kanakasabapathy et al., filed Sep. 6, 2022.
U.S. Appl. No. 18/005,571 inventors Hansen et al., filed Jan. 13, 2023.
U.S. Appl. No. 18/005,594, inventors Hansen et al., filed Jan. 13, 2023.
U.S. Appl. No. 18/254,787, inventors Dictus D, et al., filed May 26, 2023.
U.S. Appl. No. 18/264,391, inventors Kanakasabapathy S K, et al., filed Aug. 4, 2023.
U.S. Appl. No. 18/298,003, inventors Marks et al., filed Apr. 10, 2023.
U.S. Appl. No. 18/377,245, inventors Dictus D, et al., filed Oct. 5, 2023.
U.S. Appl. No. 18/377,267, inventors Yu J, et al., filed Oct. 5, 2023.
U.S. Appl. No. 18/546,879, inventors Weidman T W, et al., filed Aug. 17, 2023.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.

(56) References Cited

OTHER PUBLICATIONS

U.S. Restriction requirement dated Sep. 7, 2023 in U.S. Appl. No. 17/309,587.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
JP Office Action dated Dec. 26, 2023 in JP Application No. 2021-526240, with English Translation.

METHODS FOR MAKING HARD MASKS USEFUL IN NEXT-GENERATION LITHOGRAPHY

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

The present disclosure relates to systems and methods for making imaging layers on the surface of a substrate. Such imaging layers may be patterned using next generation lithographic techniques, and the resulting patterned film may be used as a lithographic mask, for example, for production of a semiconductor device.

BACKGROUND

The background description provided herein generally presents the context of the present technology. Work of the presently named inventors, to the extent it is described in this background section, as well as aspects of the description that may not otherwise qualify as prior art at the time of filing, are not admitted as prior art against the present technology.

The fabrication of semiconductor devices, such as integrated circuits, is a multi-step process involving photolithography. In general, the process includes the deposition of material on a wafer, and patterning the material through lithographic techniques to form structural features (e.g., transistors, conductors and other circuit features) of the semiconductor device. The steps of a typical photolithography process known in the art include: preparing the substrate; applying a photoresist, such as by spin coating; exposing the photoresist to light in a desired pattern, causing the exposed areas of the photoresist to become either more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever-smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing so-called "next-generation lithography" techniques using e-beam radiation or shorter wavelength light, such as extreme ultraviolet (EUV) radiation having wavelengths less than 20 nm, e.g., 13.5 nm.

Next generation lithographic techniques can present challenges, however. For example, the efficacy of EUV photolithographic processes can be limited by low power output of light sources and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, the required thickness of conventional CAR materials can result in high aspect ratios at risk of pattern collapse. Accordingly, there remains a need for improved EUV photoresist materials, having such properties as decreased thickness, greater absorbance, and greater etch resistance.

SUMMARY

The present disclosure provides methods for making imaging layers on the surface of a substrate. Such imaging layers may be patterned using next generation lithographic techniques, generally such as DUV, EUV, X-ray and e-beam, into chemically distinct regions (i.e., surface imaging). The resulting patterned film may be used, for example, as a lithographic mask for production of a semiconductor device.

In some implementations, methods in accordance with this disclosure may involve creating an imaging layer of a SnOx thin film that is terminated with alkyl groups selected such that they will undergo tin-carbon bond cleavage, such as beta-hydride elimination, upon irradiation with EUV light. In an EUV patterning step, the alkyl groups can be cleaved, leaving regions of Sn—H bonds while the unexposed surfaces remain alkyl-terminated.

In one embodiment, a method of making an imaging layer on a substrate, involves providing a substrate having a surface comprising exposed hydroxyl groups, and forming a hydrocarbyl-terminated $SnO_x$ film as the imaging layer on the surface of the substrate, the hydrocarbyl-terminated $SnO_x$ film having a tin-carbon bond cleavable by irradiating the imaging layer.

In some embodiments, the substrate surface may include a SnOx underlayer to the hydrocarbyl-terminated $SnO_x$ film imaging layer. The hydroxyl-terminated $SnO_x$ underlayer on the surface of the substrate material can enhance absorption of radiation upon the irradiating of the imaging layer and generate secondary electrons from the substrate to further harvest additional EUV photons, making the EUV patterning process more sensitive and reducing the required EUV dose necessary for imaging layer exposure.

In various embodiments, the imaging layer may be deposited by an atomic layer deposition process exhibiting self-limiting characteristics. In other embodiments, the imaging layer is a thin film deposited by a (non-self-limiting) chemical vapor deposition process.

For example, the alky-substituted tin capping agent may be of the general formula

wherein R is a $C_2$-$C_{10}$ alkyl or substituted alkyl substituent. X may be any suitable leaving group readily displaced by water to form hydroxyl intermediates, which in turn react with other Sn—X functionality to create Sn—O—Sn crosslinks. In various embodiments R is branched, having multiple beta-hydrogen atoms (the maximum corresponding to a tert-butyl substituent). For example, R may be t-butyl, t-pentyl, t-hexyl, cyclohexyl, isopropyl, isobutyl, sec-butyl, n-butyl, n-pentyl, or n-hexyl or derivatives thereof, as well as analogous materials containing one or more heteroatoms, such as fluorine, chlorine, bromine, iodine, nitrogen and oxygen.

The present technology also provides methods for forming a pattern on a surface of a coated substrate made by the methods of the present technology, using EUV or other radiation. Further processing of the coated substrate may exploit chemical differences in the exposed and unexposed regions, in particular the hydrocarbyl-terminated $SnO_x$ converted to hydrogen-terminated $SnO_x$ in the exposed region(s) of the imaging layer. The difference in properties between exposed and unexposed areas may be exploited in subsequent processing, such as by reacting the irradiated region, the unirradiated region, or both, with one or more reagents to selectively add material to or remove material from the imaging layer.

In various embodiments, the present technology provides methods of patterning thin etch resistant hard mask layers on the surface of a substrate, comprising:
  providing a substrate comprising a substrate material having a surface comprising exposed hydroxyl groups;
  depositing an imaging layer on the surface, the imaging layer comprising hydrocarbyl-terminated $SnO_x$;
  selectively irradiating the imaging layer, such that the imaging layer comprises an irradiated region wherein a hydrocarbyl-substituent on a $SnO_x$ moiety of the hydrocarbyl-terminated imaging layer is removed and/or converted to a hydrogen-terminated $SnO_x$, and an unirradiated region wherein the imaging layer comprises the hydrocarbyl-terminated $SnO_x$; and
  processing the imaging layer by reacting the irradiated region, the unirradiated region, or both, with one or more reagents to selectively deposit or remove material from the imaging layer.

The irradiating may comprise the use of DUV, EUV, X-ray or e-beam radiation. In some embodiments, the processing further comprises oxidizing the hydrogen-terminated (Sn—H) functionality in the irradiated region to form a Sn—OH hydroxyl-terminated $SnO_x$.

Further areas of applicability of the present technology will become apparent from the detailed description, the claims and the drawings. The detailed description and specific examples are intended for purposes of illustration only and are not intended to limit the scope of the technology.

BRIEF DESCRIPTION OF THE DRAWINGS

The present technology will become more fully understood from the detailed description and the accompanying drawings, of which.

DETAILED DESCRIPTION

Figure 1:
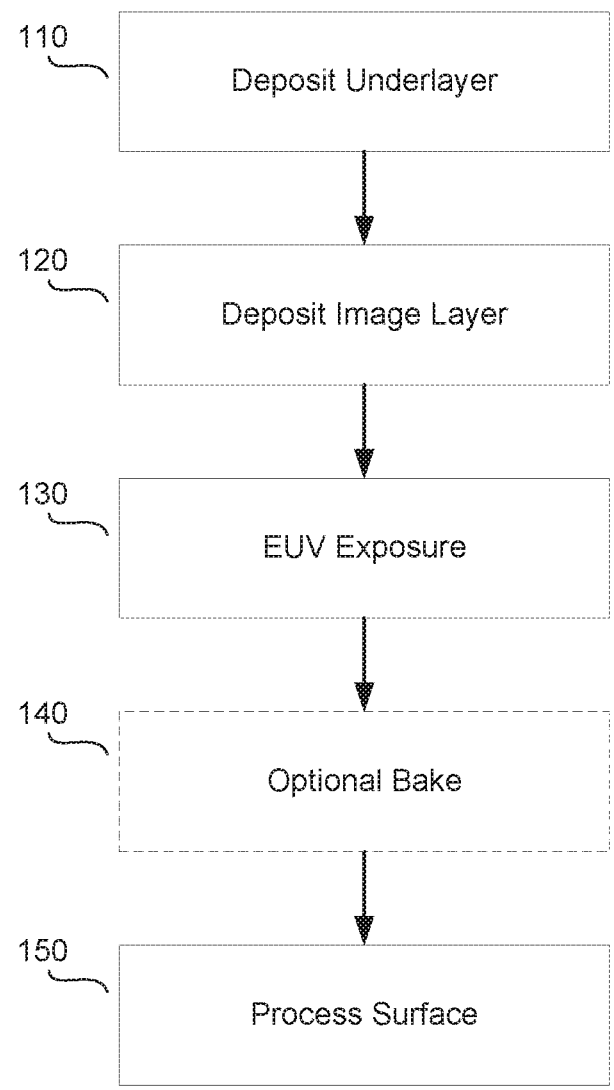
FIG. 1 is a flow chart of an exemplary process of the present technology.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

As discussed above, the present disclosure provides methods for making imaging layers on semiconductor substrates, which may be patterned using EUV or other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. Such methods include those where a substrate, having exposed hydroxyl groups, is contacted with a hydrocarbyl-substituted tin capping agent to form a hydrocarbyl-terminated $SnO_x$ film as the imaging layer on the surface of the substrate. In various embodiments, the imaging layer is a thin layer that may function as an adhesion layer over a substrate to facilitate selective deposition of additional materials on the substrate, such as in forming hard masks for lithographic processes. The specific methods may depend on the particular materials and applications used in the semiconductor substrate and ultimate semiconducting device. Thus, the methods described in this application are merely exemplary of the methods and materials that may be used in present technology.

Substrates

Substrates useful in the methods of the present technology may include any material construct suitable for lithographic processing, particularly for the production of integrated circuits and other semiconducting devices. In some embodiments, substrates are silicon wafers. Substrates may be silicon wafers upon which features have been created ("underlying topographical features"), having an irregular surface topography. (As referred to herein, the "surface" is a surface onto which a film of the present technology is to be deposited or that is to be exposed to EUV during processing.) Such underlying topographical features may include regions in which material has been removed (e.g., by etching) or regions in which materials have been added (e.g., by deposition) during processing prior to conducting a method of this technology. Such prior processing may include methods of this technology or other processing methods in an iterative process by which two or more layers of features are formed on the substrate.

In some embodiments, the substrate is a hard mask, which is used in lithographic etching of an underlying semiconductor material. The hard mask may comprise any of a variety of materials, including amorphous carbon (a-C), $SnO_x$, $SiO_2$, $SiO_xN_y$, $SiO_xC$, $Si_3N_4$, $TiO_2$, TiN, W, W-doped C, $WO_x$, $HfO_2$, $ZrO_2$, and $Al_2O_3$. For example, the substrate may preferably comprise $SnO_x$, such as $SnO_2$. In various embodiments, the layer may be from 1 nm to 100 nm thick, or from 2 nm to 10 nm thick.

In various embodiments, the substrate comprises exposed hydroxyl groups on its surface. In general, the surface may be any surface that comprises, or has been treated to produce, an exposed hydroxyl surface. (As referred to herein, "surface" means a portion of the substrate which defines the boundary between the substrate and another material or lack thereof (e.g., a gas, coating or vacuum), and may be, in various embodiments, available for exposure to radiation or reaction with components in the other material.) Thus, methods may include "providing" such a substrate, wherein the substrate having exposed hydroxyl groups is obtained as a starting material apart from the methods of the present technology, or produced as part of a single process comprising formation of hydroxyl groups on a substrate followed by contacting the surface with a hydroxyl-substituted tin capping agent, as noted above and described further below. For example, such hydroxyl groups may be formed on the surface of the substrate by surface treatment of a substrate using oxygen plasma, water plasma, or ozone.

In some embodiments, a substrate comprising exposed hydroxyl groups comprises a surface layer or film comprising hydroxyl-terminated $SnO_x$. For example, the substrate may comprise amorphous carbon having a surface of hydroxyl-terminated $SnO_x$. Without limiting the mechanism, function or utility of present technology, it is believed that the hydroxyl-terminated $SnO_x$ layer may offer benefits such as improved adhesion of materials deposited on the surface of the substrate and enhanced absorption of EUV (or other radiation) during patterning. Sensitivity to EUV or other irradiation and resolution may be dependent on the properties of the $SnO_x$ layer, such as thickness, density and short range charge transfer characteristics. In various embodiments, the $SnO_x$ layer has a thickness of from 0.1 nm to 20 nm, or from 0.2 nm to 10 nm, or from 0.5 nm to 5 nm.

In some embodiments, the hydroxyl-terminated $SnO_x$ layer is deposited on the surface of the substrate by vapor deposition. In such methods, the deposition comprises reacting Sn—X with an oxygen-containing counter-reactant, wherein X is a ligand such as dialkylamido, (e.g., dimethylamido, methylethylamido, and diethylamido), alcohol (e.g., t-butoxy, and isopropoxy), halogen (e.g., F, Cl, Br, and I), or other organic substituent (e.g., acetylacetone, N2,N3-di-tertbutyl-butane-2,3-diamido). For example, Sn—$X_n$ may be $SnCl_4$, $SnI_4$, or $Sn(NR_2)_4$ wherein R is =methyl or ethyl, or $Sn(t-BuO)_4$. In some embodiments, multiple types of ligands are present. The oxygen-containing counter-reactant may be selected from the group consisting of water, hydrogen peroxide, formic acid, alcohols, oxygen, ozone, and combinations thereof.

Suitable vapor deposition processes include chemical vapor deposition (CVD), atomic layer deposition (ALD), plasma-enhanced chemical vapor deposition (PECVD), or plasma-enhanced atomic layer deposition (PEALD). In some embodiments, the deposition is ALD, in a cyclical process of depositing the Sn—X and depositing the oxygen-containing counter-reactant. In some embodiments, the deposition is CVD, by simultaneously flowing the Sn—X and the oxygen-containing counter-reactant. Materials and processes among those useful herein for depositing $SnO_x$ layers are described in Nazarov et al., Atomic Layer Deposition of Tin Dioxide Nanofilms: A Review, 40 Rev. Adv. Mater. Sci 262 (2015).

In an exemplary continuous CVD process, two or more gas streams, in separate inlet paths, of Sn—$X_n$ and source of oxygen-containing counter-reactant are introduced to the deposition chamber of a CVD apparatus, where they mix and react in the gas phase, to form the $SnO_x$ coating on the substrate. The streams may be introduced, for example, using a dual plenum showerhead. The apparatus is configured so that the streams of Sn—$X_x$ and source of oxygen-containing counter-reactant are mixed in the chamber, allowing the Sn—$X_x$ and source of oxygen-containing counter-reactant to react to form the $SnO_x$ layer. The CVD process is generally conducted at reduced pressures, such as from 0.1 Torr to 10 Torr. In some embodiments, the process is conducted at from 1-2 Torr. The temperature of the substrate is preferably below the temperature of the reactant streams. For example, the substrate temperature may be from 0° C. to 250° C., or from ambient temperature (e.g., 23° C.) to 150° C.

A $SnO_x$ substrate may also be deposited by an ALD process. For example, the Sn—$X_n$ and oxygen-containing counter-reactant are introduced at separate times. The precursors react on the surface, forming up to a monolayer of material at a time for each pulse. This may allow excellent control over the uniformity of film thickness across the surface. The ALD process is generally conducted at reduced pressures, such as from 0.1 Torr to 10 Torr. In some embodiments, the process is conducted from 1-2 Torr. The substrate temperature may be from 0° C. to 250° C., or from ambient temperature (e.g., 23° C.) to 150° C. The process may be a thermal process or, preferably, a plasma-assisted deposition.

Tin Capping Agent

Hydrocarbyl-substituted tin capping agents useful herein include substituents that undergo tin-carbon bond cleavage upon irradiating of the imaging layer. Such cleavage may be homolytic. In some embodiments, the cleavage may occur by beta-hydride elimination to release an alkene fragment, leaving behind a hydrogen atom bonded to the tin atom that originally bore the alkyl substituent.

The specific tin capping agent may be selected depending on the intended lithographic process, i.e., the specific irradiation that is to be used. Further, the hydrocarbyl-substituted tin capping agent may be selected so as to serve as a barrier to subsequent deposition of materials onto the substrate. Thus, in some embodiments, the hydrocarbyl-substituted tin capping agent is an atomic layer deposition blocking agent to prevent the attachment or growth of soluble metal oxide precursors from solutions brought into contact with the surface.

In various embodiments, the hydrocarbyl-substituted tin capping agent is alkyl-substituted, such as an agent of the following general formula:

$$R_nSnX_m$$

wherein R is a $C_2$-$C_{10}$ alkyl or substituted alkyl having a beta-hydrogen, X is a suitable leaving group upon reaction with an hydroxyl group of the exposed hydroxyl groups, and, in various embodiments, n=1-3, and m=4−n. For example, R may be t-butyl, t-pentyl, t-hexyl, cyclohexyl, isopropyl, isobutyl, sec-butyl, n-butyl, n-pentyl, or n-hexyl or derivatives thereof having a heteroatom substituent in the beta position. Suitable heteroatoms include halogen (F, Cl, Br, or I), or oxygen (—OH or —OR). X may be dialkylamido, (e.g., dimethylamido, methylethylamido, or diethylamido), an alcohol (e.g. t-butoxy, isopropoxy), halogen (e.g., F, Cl, Br, or I), or another organic ligand. Examples of hydrocarbyl-substituted tin capping agents include t-butyltris(dimethylamino)tin, n-butyltris(dimethylamino)tin, t-butyltris(diethylamino) tin, di(t-butyl)di(dimethylamino) tin, secbutyltris(dimethylamino)tin, n-pentyltris(dimethylamino)tin, isobutyltris(dimethylamino)tin, isopropyltris(dimethylamino)tin, t-butyltris(t-butoxy)tin, n-butyl(tris(t-butoxy)tin, or isopropyltris(t-butoxy)tin.

Method of Making an Imaging Layer

In various aspects, methods of the present technology comprise:
  providing the substrate having the surface, wherein the surface comprises exposed hydroxyl groups; and
  contacting the surface with an hydrocarbyl-substituted tin capping agent, to form a hydrocarbyl-terminated $SnO_x$ film as the imaging layer on the surface of the substrate.

In general, contacting the surface with the hydrocarbyl-substituted tin capping agent may be performed using any suitable technique, preferably so as to create a uniform distribution of the capping agent on the surface. Such methods include vapor deposition techniques such as ALD and CVD. Water may also be dosed to aid in the reaction of the capping agent with the exposed hydroxyl groups of the substrate. Such methods may employ repeated applications of the capping agent and water to form a surface sufficiently saturated with the hydrocarbyl-substituted tin capping functionality. Exposure to additional alky-based reagents, such as alky thiols, may be used to form a surface having an increased level of hydrocarbyl substituents on the surface of the substrate.

In an exemplary continuous CVD process, two or more gas streams, in separate inlet paths, of $R_n$ Sn—$X_m$ and source of oxygen-containing counter-reactant are introduced to the deposition chamber of a CVD apparatus, where they mix, react in the gas phase, and condense to form the $SnO_x$ coating on the substrate. The streams may be introduced, for example, using dual-plenum showerhead. The apparatus is configured so that the streams of $R_n$ Sn—$X_m$ and source of oxygen-containing counter-reactant are mixed in the chamber, allowing the $R_n$ Sn—$X_m$ and source of oxygen-containing counter-reactant to react to form the $SnO_x$ layer. The CVD process is generally conducted at reduced pressures, such as from 0.1 Torr to 10 Torr. In some embodiments, the process is conducted at from 1-2 Torr. The temperature of the substrate is preferably below the temperature of the reactant streams. For example, the substrate temperature may be from 0° C. to 250° C., or from ambient temperature (e.g., 23° C.) to 150° C.

A $SnO_x$ imaging layer may also be deposited by an ALD process. In this case, the $R_n$Sn—$X_m$ and oxygen-containing counter-reactant are introduced at separate times, representing an ALD cycle. The precursors react on a surface, forming up to a monolayer of material at a time for each ALD cycle. This allows for excellent control over the film thickness uniformity across the wafer. The ALD process is generally conducted at reduced pressures, such as from 0.1 Torr to 10 Torr. In some embodiments, the process is conducted from 1-2 Torr. The substrate temperature may be from 0° C. to 250° C., or from ambient temperature (e.g., 23° C.) to 150° C. The process will be a thermal-driven process. The film is not expected to grow significantly after the first cycle and subsequent cycling is designed to further saturate the surface with R terminated Sn.

Patterning

The present technology also provides methods wherein the imaging layer is patterned by exposing a region of the imaging layer to irradiation, such as EUV, DUV or e-beam. In such patterning, the radiation is focused on one or more regions of the imaging layer. The exposure is typically performed such that imaging layer film comprises one or more regions that are not exposed to the radiation. The resulting imaging layer may comprise a plurality of exposed and unexposed regions, creating a pattern consistent with the creation of transistor or other features of a semiconductor device, formed by addition or removal of material from the substrate in subsequent processing of the substrate. EUV, DUV and e-beam radiation methods and equipment among useful herein include methods and equipment known in the art.

In particular, areas of the imaging layer are created through patterning that have altered physical or chemical properties relative to unexposed areas. In particular, in various embodiments, the hydrocarbyl-terminated $SnO_x$ present on the surface is be converted to hydrogen-terminated $SnO_x$ in the exposed region(s) of the imaging layer, particularly when the exposure is performed in a vacuum using EUV. However, removing exposed imaging layers from vacuum into air, or the controlled introduction of oxygen, ozone, $H_2O_2$ or water, can result in the oxidation of surface Sn—H into Sn—OH The difference in properties between exposed and unexposed areas may be exploited in subsequent processing, such as by reacting the irradiated region, the unirradiated region, or both, with one or more reagents to selectively add material to or remove material from the imaging layer.

Accordingly, in various embodiments, the present technology provides methods of making a lithographic hard mask on the surface of a substrate, comprising:
  providing a substrate comprising a substrate material having a surface comprising exposed hydroxyl groups;
  depositing an imaging layer on the surface, the imaging layer comprising hydrocarbyl-terminated $SnO_x$;
  selectively irradiating the imaging layer, such that the imaging layer comprises an irradiated region wherein the hydrocarbyl-terminated $SnO_x$ of the imaging layer has been converted to hydrogen-terminated $SnO_x$ and an unirradiated region wherein the imaging layer comprises the hydrocarbyl-terminated $SnO_x$; and processing the imaging layer by reacting the irradiated region, the unirradiated region, or both, with one or more reagents to selectively add material to or remove material from the imaging layer.

In various embodiments, the substrate material comprises amorphous carbon or $SnO_x$.

Optionally, the imaging layer is heated or "baked" so as to remove excess moisture and drive the Sn—O—Sn cross-linking. For example, the sample can be baked at conditions so the R—Sn bonds will not be significantly cleaved, such as between 50° C. and 200° C. for 5 min. or between 70° C. and 150° C. for 2 min.

Lithographic Processing

As noted above, the subsequent processing of the imaging layer, following irradiation, will depend on the substrate materials and the desired features of the semiconducting device made using the substrate. For example, features may be created on the substrate by various lithographic techniques, such as using spin-coat application of films which become selectively soluble in liquid developers in either exposed (positive tone) or unexposed (negative tone) areas defined by a patterned exposure tool.

Lithographic methods of the present technology are generally depicted in the process flow of FIG. 1. As shown, a substrate is formed by depositing a hydroxyl-terminated $SnO_x$ "underlayer" on a substrate material (110). The hydroxyl-terminated $SnO_x$ underlayer on the surface of the substrate can enhance absorption of radiation upon the irradiating of the imaging layer and generate secondary electrons from the substrate to further harvest additional EUV photons, making the EUV patterning process more sensitive and reducing the required EUV dose necessary for imaging layer exposure.

Figure 2:
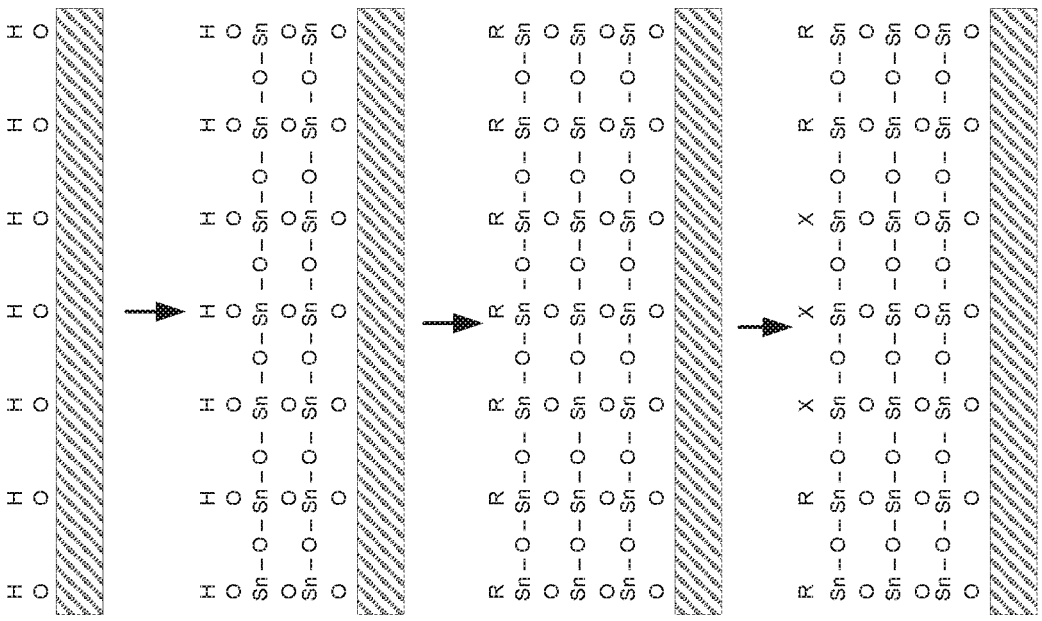
FIG. 2 depicts the general architecture of a substrate as it is formed in an exemplary process of the present technology.
Figure 2:
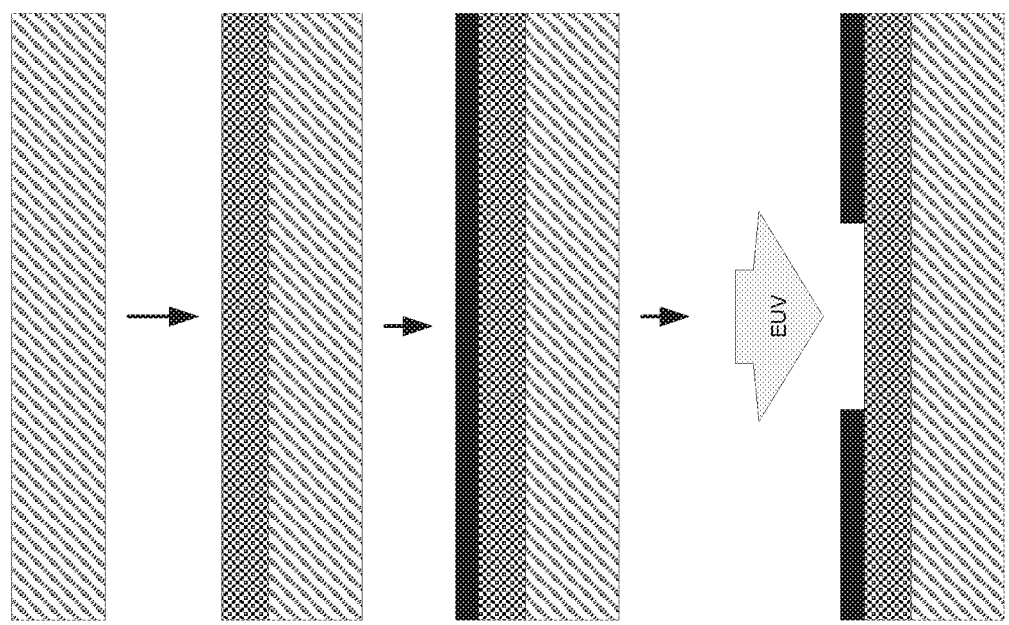
Figure 3:
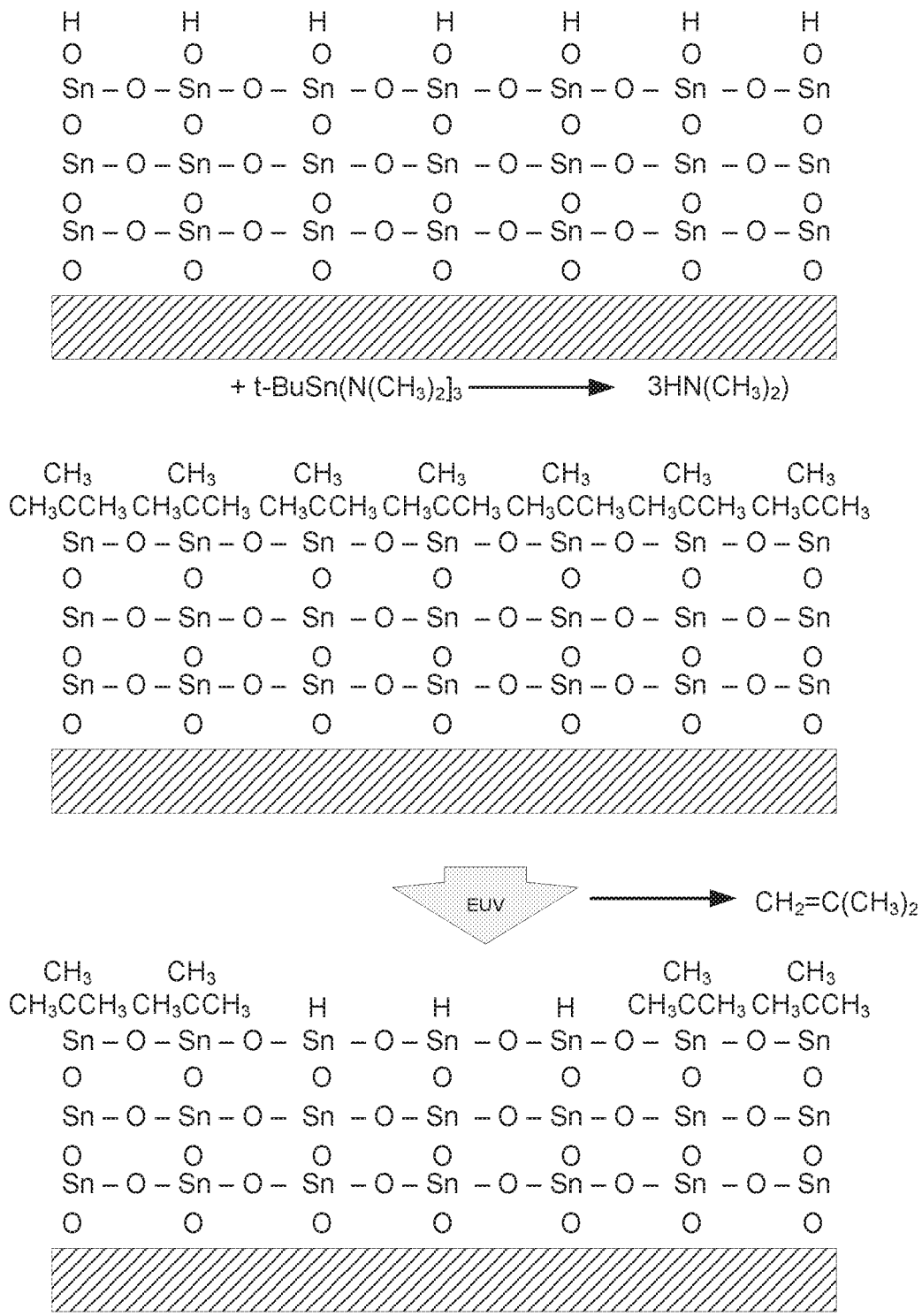
FIG. 3 further depicts the general architecture of another substrate as it is formed in an exemplary process of the present technology.
Figure 4:
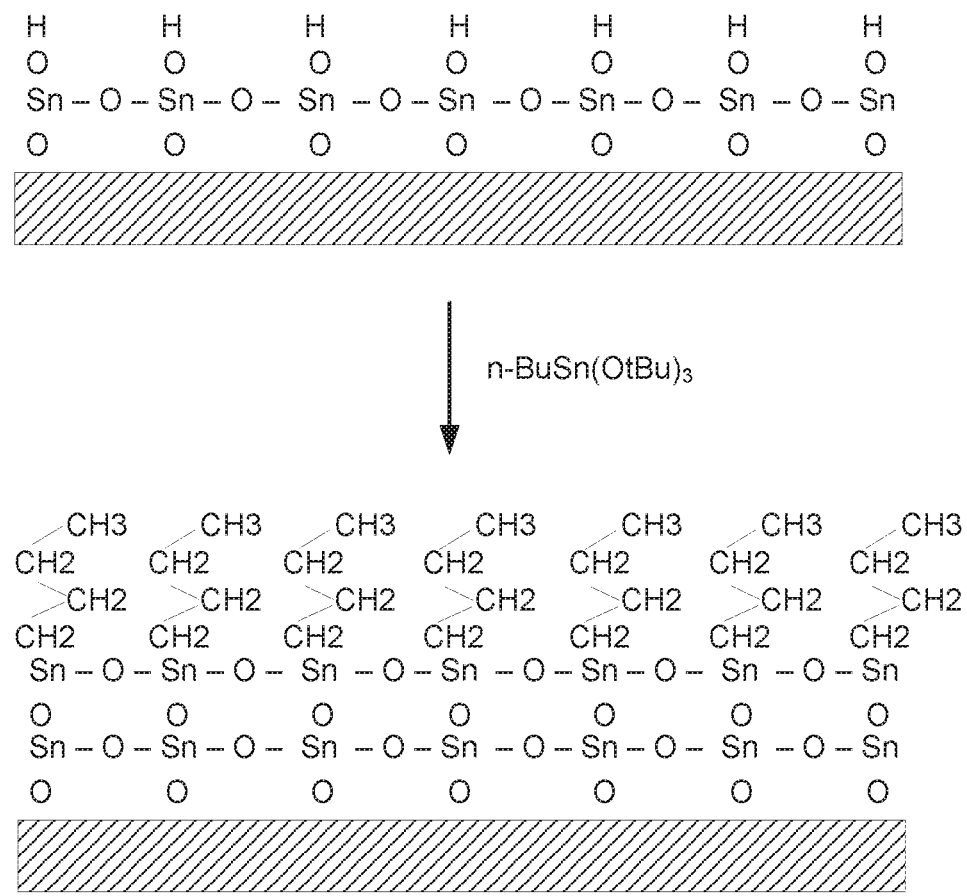
FIG. 4 further depicts the general architecture of another substrate as it is formed in an exemplary process of the present technology.

An imaging layer is then formed by depositing the surface with a hydrocarbyl-substituted tin capping agent, to form a hydrocarbyl-terminated $SnO_x$ film on the surface of the substrate (120). The substrate is then exposed to radiation, (e.g., using EUV) (130), and, optionally, baked (140). The imaging layer surface is then processed (150). FIG. 2 depicts schematically and with sample chemical structures the general architecture of a substrate as it is formed in such a process. FIG. 3 depicts a specific instance of such a process, wherein the imaging layer is formed from the hydrocarbyl-substituted tin capping agent t-butylSn(N(CH$_3$)$_2$)$_3$. FIG. 4 depicts an alternative for an active (EUV release) PR adhesion imaging layer formed from the tin capping agent is n-BuSn(OtBu)$_3$.

In some methods, the processing comprises oxidizing the hydrogen-terminated $SnO_x$ in the irradiated region to form a hydroxyl-terminated $SnO_x$. The oxidizing may comprise exposing the irradiated region to oxygen or water. In some methods, subsequent processing comprises removing the hydroxyl-terminated $SnO_x$ in the irradiated region to expose and etch underlying substrate material. The etching may be performed by treating the patterned film with dilute aqueous hydrofluoric acid or alternatively dilute aqueous tetramethylammonium hydroxide (TMAH). Processing may further comprise etching of an underlying substrate layer using oxygen plasma.

In some embodiments, processing further comprises depositing a metal oxide, which may be operable as a hard mask, on the hydroxyl-terminated $SnO_x$ of the irradiated region. Such hard mask material may comprise a metal oxide selected from the group consisting of $SnO_2$, $SiO_2$, $TiO_2$, $WO_x$, $HfO_2$, $ZrO_2$, $Ta_2O_5$, $Nb_2O_5$, $B_2O_3$, $GeO_2$, $ZnO$, $V_2O_5$, and $Al_2O_3$. The deposition may be performed, for example, by ALD.

In some methods of the present technology, the hydrocarbyl-terminated $SnO_x$ of the unirradiated region is removed by hydrogen or methane plasma to expose the underlying amorphous carbon layer. Processing may further comprise etching of the underlying substrate material using oxygen plasma.

Without limiting the mechanism, function or utility of present technology, it is believed that, in some embodiments, lithographic methods of the present technology offer benefits over methods among those known in the art, such as avoiding the need to apply and remove wet resist formulations (e.g., avoiding scumming and pattern distortion), simplifying processes such as developing exposed substrates under vacuum in a continuous process following EUV or other irradiation, reducing pattern collapse through use of very thin metal oxide structures, improving line edge roughness, and offering the ability to tune hardmask chemistry to the specific substrate and semiconductor device design.

Additional Embodiments

As noted above, specific post-imaging methods and applications of the present technology may involve any of a variety of materials and processes depending on the substrate and desired device design. The processing of the imaging layer may depend on the substrate materials and the desired features of the semiconducting device to be made using the substrate. For example, features may be created on the substrate by various standard lithographic techniques, typically involving the application of films which become selectively soluble in developers in either exposed (positive tone) or unexposed (negative tone) areas defined by a patterned exposure tool. Processing may also include making lithographic masks comprising directed self-assembled (DSA) block co-polymers (BCP), directed self-assembly of sol-gels, and selective deposition of material (e.g., metal or metal oxide) by atomic layer deposition or chemical vapor deposition.

For example, in some embodiments, processing of the imaging layer and substrate creates a positive tone mask. Such methods may include:
- selectively irradiating regions of an imaging layer of a substrate made by methods of the present technology;
- oxidizing hydrogen-terminated $SnO_x$ in the irradiated region to form a hydroxyl-terminated $SnO_x$ such as reacting the irradiated regions with air or water;
- contacting the irradiated regions with dilute aqueous hydrofluoric acid (HF) or dilute aqueous tetramethylammonium hydroxide (TMAH) to etch the exposed hydroxyl-terminated surface, exposing the underlying substrate material (e.g., amorphous carbon); and
- etching the exposed underlayer with oxygen plasma.

In some embodiments, processing of the imaging layer and substrate creates a negative tone resist. For example, such methods may include:
- selectively irradiating regions of an imaging layer of a substrate made by methods of the present technology;
- oxidizing hydrogen-terminated $SnO_x$ in the irradiated region to form a hydroxyl-terminated $SnO_x$, such as reacting the irradiated regions with air or water;
- selectively depositing, such as by ALD, a metal oxide hard mask on the hydroxyl-terminated regions;
- removing the unexposed regions (i.e., regions having hydrocarbyl-terminate $SnO_x$) of the substrate, such as using an $H_2$, $CH_4$ or $BCl_3$-based plasma, to expose the underlying substrate (e.g., amorphous carbon); and
- etching the exposed underlying substrate with oxygen plasma.

Figure 5:
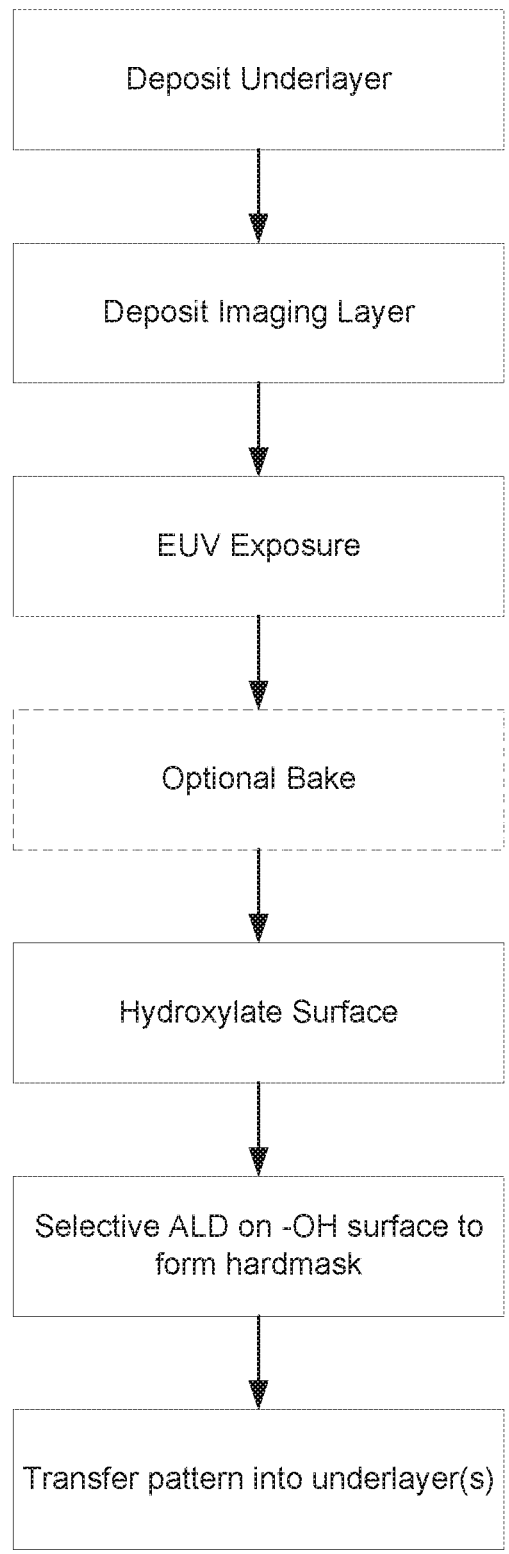
FIG. 5 is a flow chart of an exemplary negative tone resist process of the present technology.
Figure 6:
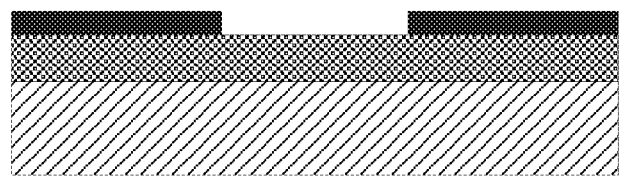
FIG. 6 schematically depicts the general architecture of a mask as it is formed in a negative tone resist process of FIG. 5.
Figure 6:
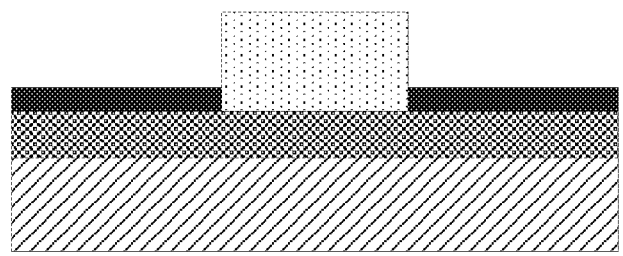
Figure 6:
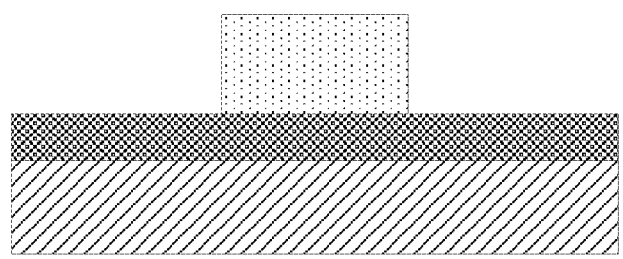
Figure 6:
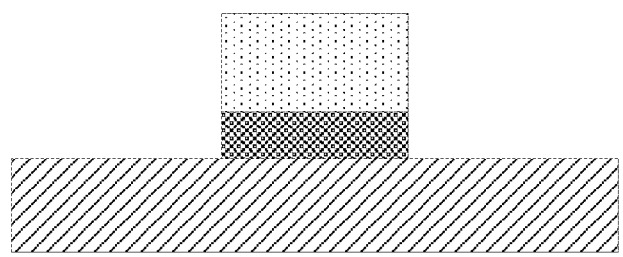
Figure 7A:
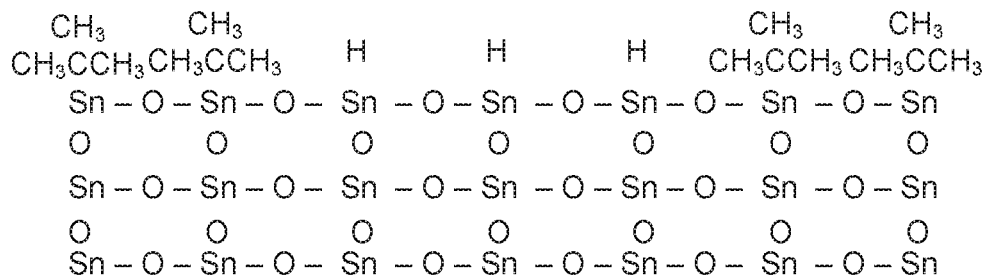
FIGS. 7A-B depict with sample chemical structures the general architecture of a mask as it is formed in a negative tone resist process of FIG. 5.
Figure 7A:
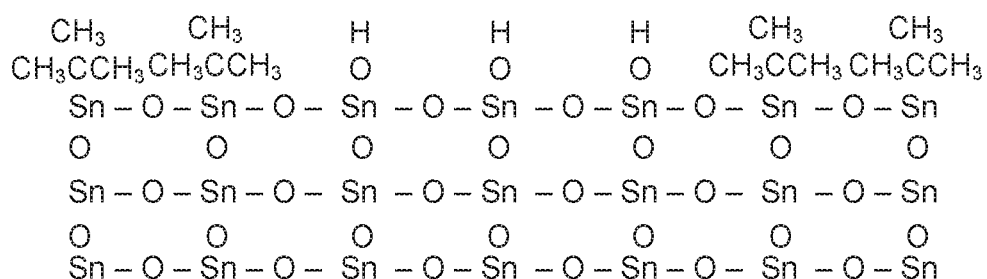
Figure 7A:
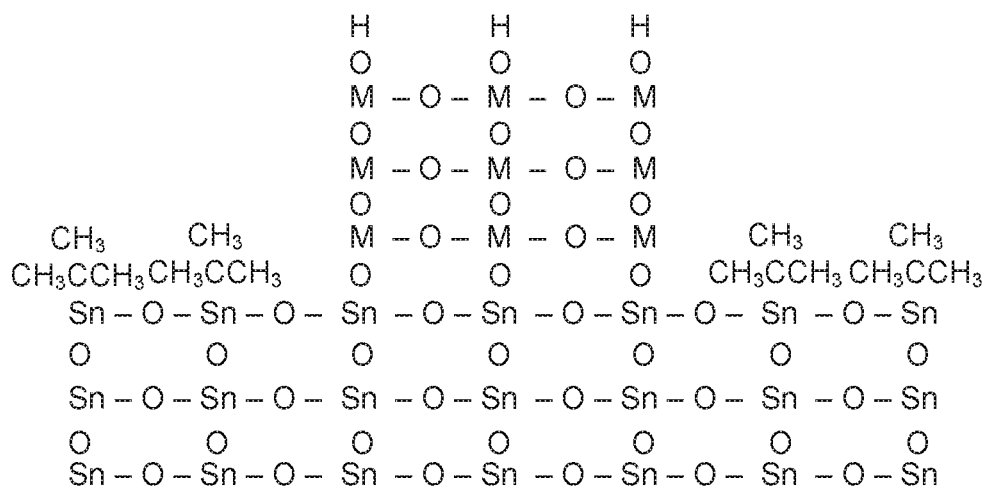
Figure 7B:
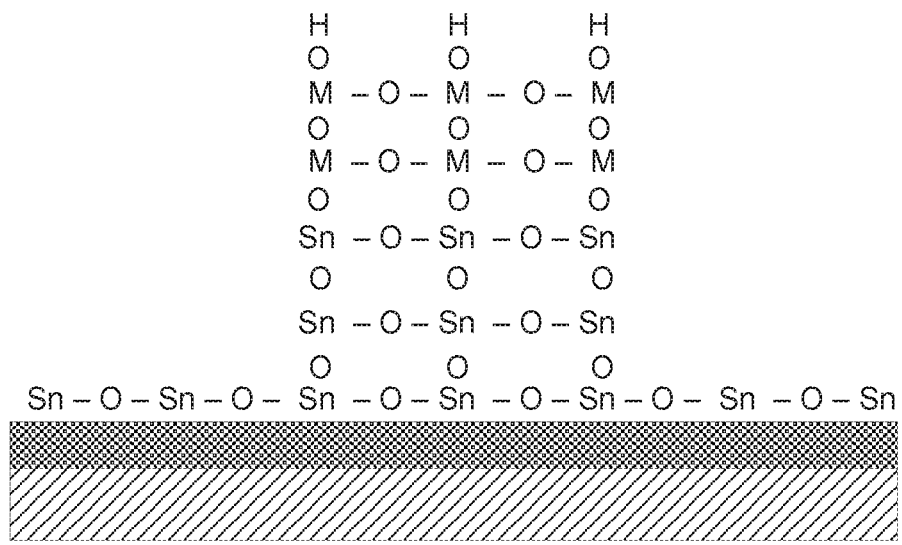
Figure 7B:
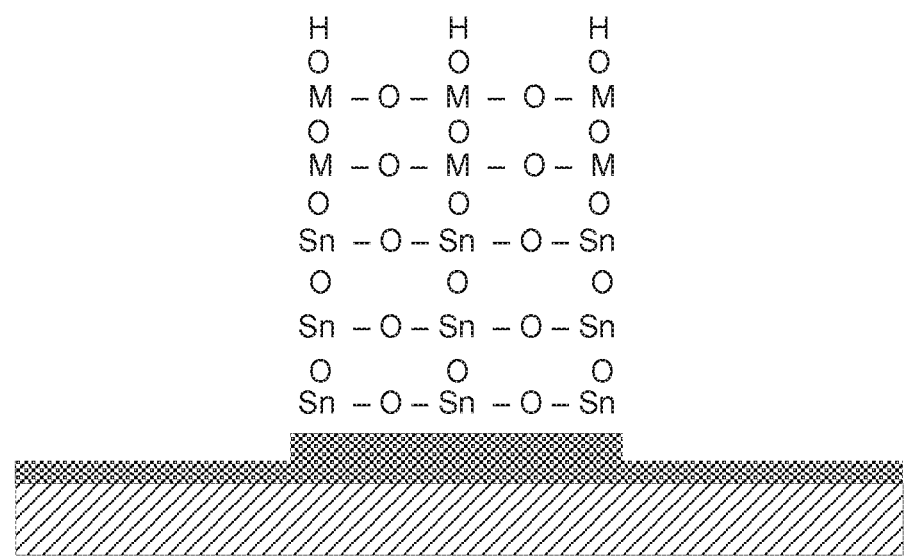

Elements of one such process are depicted in a process flow in FIG. 5. FIGS. 6, and 7A-B depict the general architecture of a mask as it is formed (starting from the hydroxylation of the exposed surface) in one such negative tone resist process schematically and with sample chemical structures, respectively.

Figure 8:
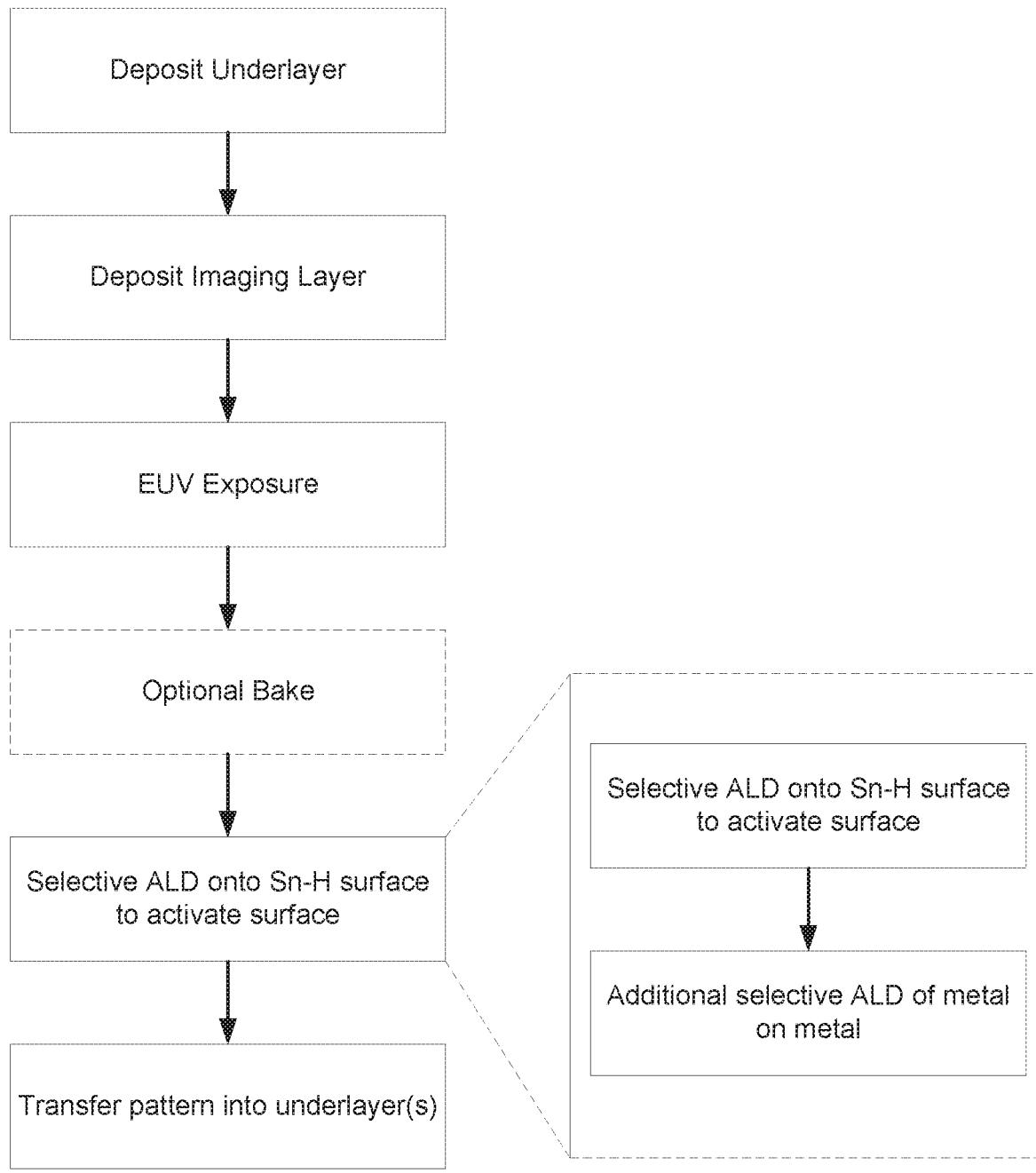
FIG. 8 is a flow chart of an alternative exemplary negative tone resist process of the present technology.
Figure 9:
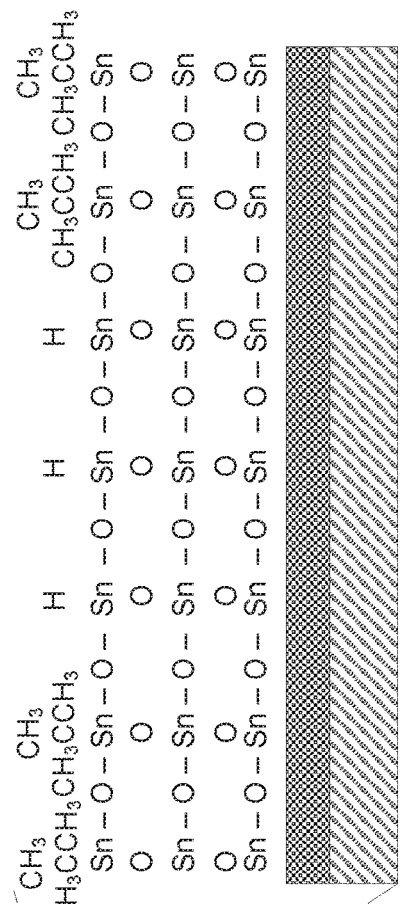
FIG. 9 depicts the general architecture of a mask as it is formed in the negative tone resist process of FIG. 8.
Figure 9:
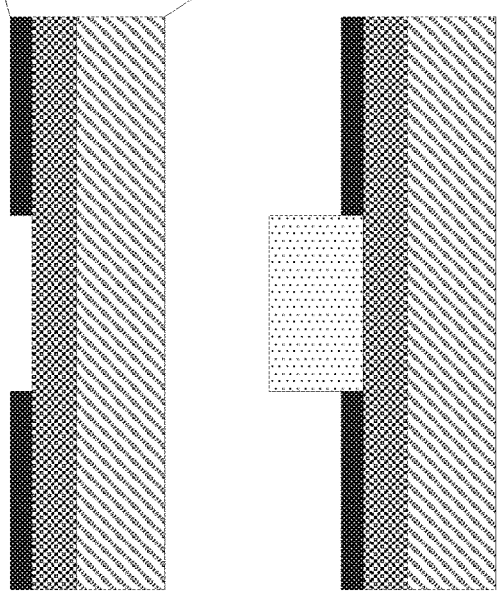
Figure 9:
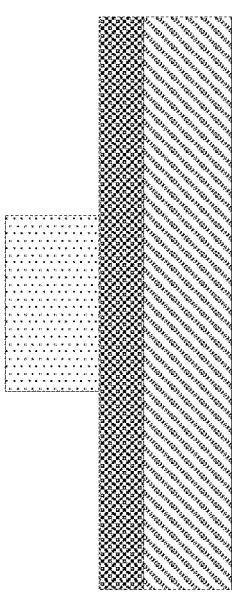
Figure 9:
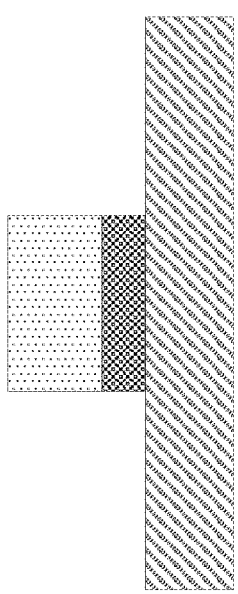

The elements of an alternative negative tone resist process are depicted in FIG. 8. In this process, the hydrogen-terminated $SnO_x$ in the irradiated region is not oxidized. Rather, a metal or metal oxide hard mask is deposited, such as by ALD, on the Sn—H surface of the irradiated region. General methods and conditions for ALD deposition of metals on hydride surfaces include those described in Kwon, et. al., *Substrate Selectivity of ('Bu-Allyl)Co(CO)$_3$ during Thermal Atomic Layer Deposition of Cobalt*, 24 Chem. Mater. 1025 (2012), and Lemaire, et. al., *Understanding inherent substrate selectivity during atomic layer deposition: Effect of surface preparation, hydroxyl density, and metal oxide composition on nucleation mechanisms during tungsten ALD*, 146 J. Chem. Phys. 052811 (2017). In such a process, the substrate may be maintained under vacuum from irradiation through the deposition of ALD, simplifying material handling procedures during the process and potentially offering efficiencies in manufacturing. FIG. 9 depicts the general architecture of a mask as it is formed in an alternative negative tone resist process.

In some embodiments, processing of the imaging layer and substrate employs negative tone patterning. For example, such methods may include:
- selectively irradiating regions of an imaging layer of a substrate made by methods of the present technology;
- oxidizing hydrogen-terminated $SnO_x$ in the irradiated region to form a hydroxyl-terminated $SnO_x$ such as reacting the irradiated regions with air or water;
- selectively depositing solution of a metal sol-gel oxide (e.g., spin-coated tetraethylorthosilicate at pH 2 with nitric acid) on the hydroxyl-terminated regions to form a metal oxide etch mask on the irradiated regions;
- removing (e.g., by rinsing) unreacted sol-gel solution;
- removing the unexposed regions (i.e., regions having hydrocarbyl-terminated $SnO_x$) of the substrate, such as using a hydrogen or methane plasma, to expose the underlying substrate (e.g., amorphous carbon); and
- etching the exposed underlying substrate with oxygen plasma.

Figure 10:
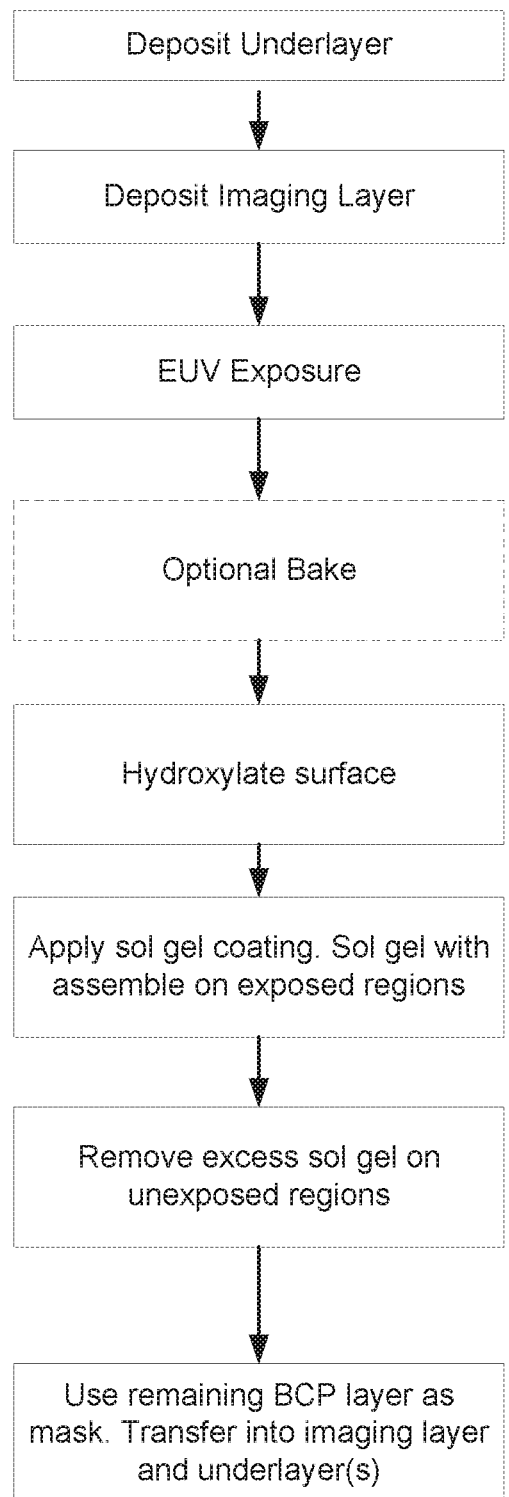
FIG. 10 is a flow chart exemplifying a process of the present technology for forming self-assembled sol gels on a substrate.

Materials and methods for making sol-gels are described in Hench, et al., *The Sol-Gel Process*, 90 Chem. Rev. 33 (1990), and Lu, et. al., *Continuous formation of supported cubic and hexagonal mesoporous films by sol-gel dip-coating*, 389 Nature 364 (1997). Elements of such a process are depicted in the process flow of FIG. 10.

In some embodiments, processing of the imaging layer and substrate comprises deposition and self-assembly of block co-polymers to pattern hydrophilic and hydrophobic regions of the imaging surface, to create a hard mask. For example, such methods for creating hard masks may include:
- selectively irradiating regions of an imaging layer of a substrate made by methods of the present technology;
- oxidizing hydrogen-terminated $SnO_x$ in the irradiated region to form a hydroxyl-terminated $SnO_x$ such as reacting the irradiated regions with air or water;
- coating the surface with a block co-polymer reactants;
- annealing the surface, to create an assembled block co-polymer;
- selectively removing a substituent of the block co-polymer to form the mask; and
- etching the exposed underlayer with oxygen plasma.

Figure 11:
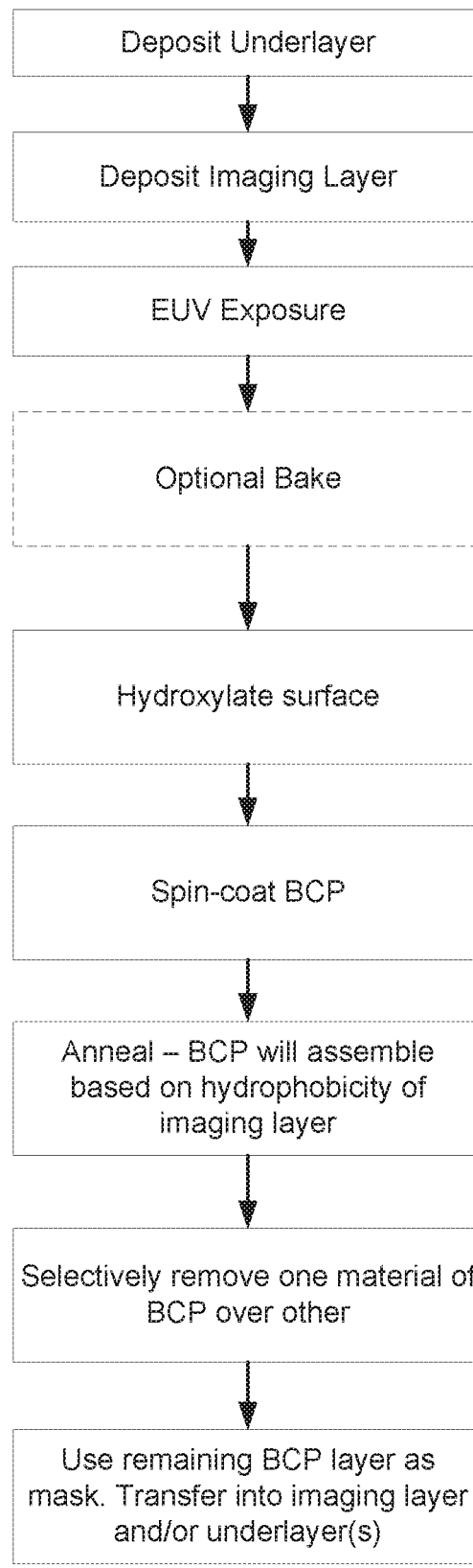
FIG. 11 is a flow chart exemplifying a process of the present technology for forming self-assembled block co-polymers on a substrate.

In some embodiments, a hydrophilic metal oxide may be deposited on hydrophilic regions of the imaging surface (i.e., the irradiated regions), prior to coating with the block co-polymer reactants, to create topography that guides self-assembly of the block co-polymers. Materials and methods for making self-assembled block co-polymers are described in Hamley, *Nanostructure fabrication using block copolymers*, 14 Nanotechnology R39 (2003). Elements of such a process are depicted in the process flow of FIG. 11. This approach can reduce the size of features and potentially reduce defects associated with BCP self-assembly.

The present technology also provides methods for selective growth of electroless metal device structures, such as for hard masks, on a substrate. For example, the surface may be exposed to aqueous solutions of oxidizing metal ions (such as $Pd^{+2}$ salts) to selectively deposit catalytic Pd "seed" atom layers for subsequent selective growth of conductive cobalt, nickel or copper features by electroless deposition (ELD). In other embodiments, exposed "deprotected" areas of a thin tin-based imaging layer, which are no longer hydrophobic, may be selectively etched away by brief exposure to an aqueous acid etchant such a concentrated HF or solutions of oxalic acid.

For example, such methods comprise:
- selectively irradiating regions of an imaging layer of substrate made by methods of the present technology;
- selectively depositing a palladium (Pd) activation layer on the exposed regions (i.e., regions having Sn—H surface moieties) of the substrate; and
- depositing, by electroless deposition, a metal, e.g., cobalt, on the Pd activation layer.

Figure 12:
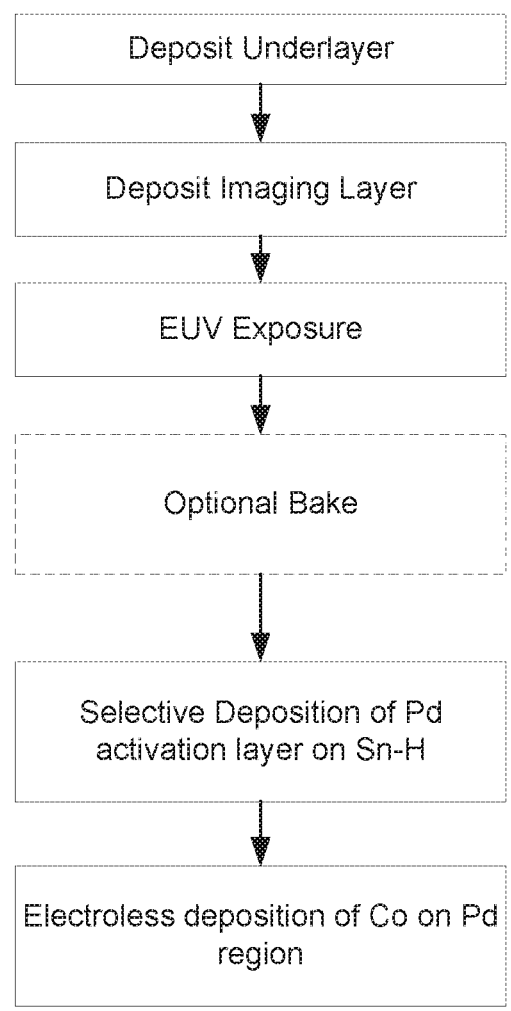
FIG. 12 is a flow chart exemplifying a process of the present technology for selective growth of metal device structures on a substrate.
Figure 13:
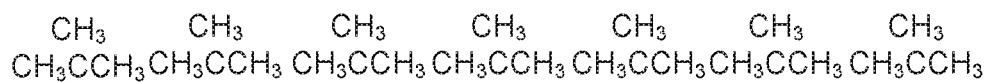
FIG. 13 depicts the general architecture of a substrate as metal is deposited in the process of FIG. 12.
Figure 13:
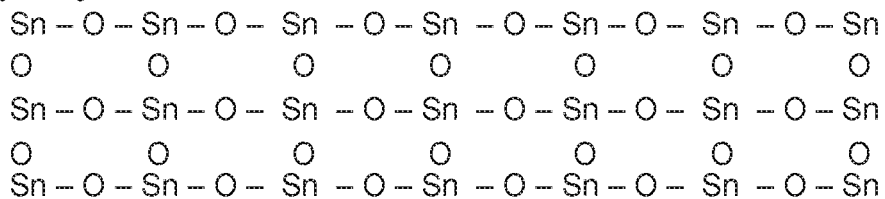
Figure 13:
Figure 13:
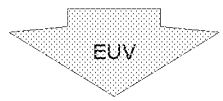
Figure 13:
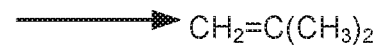
Figure 13:
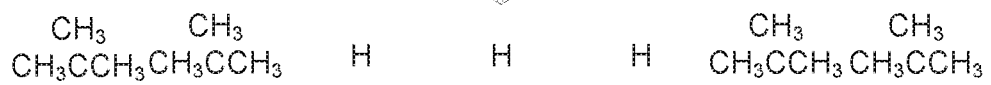
Figure 13:
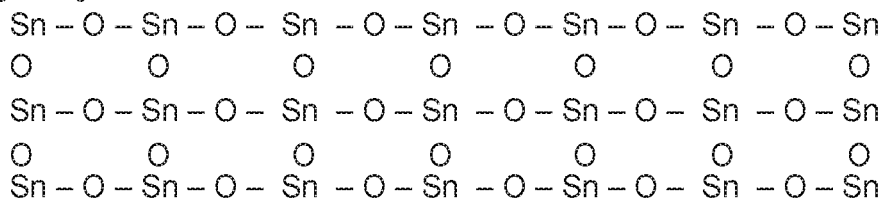
Figure 13:
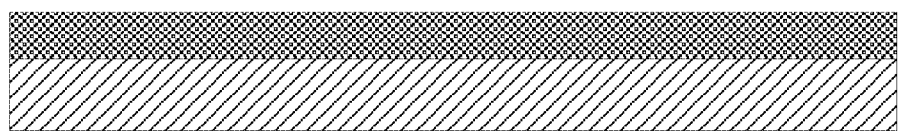
Figure 13:
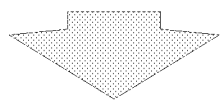
Figure 13:
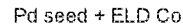
Figure 13:
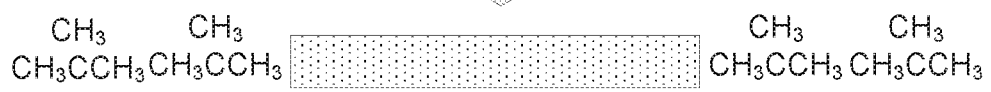
Figure 13:
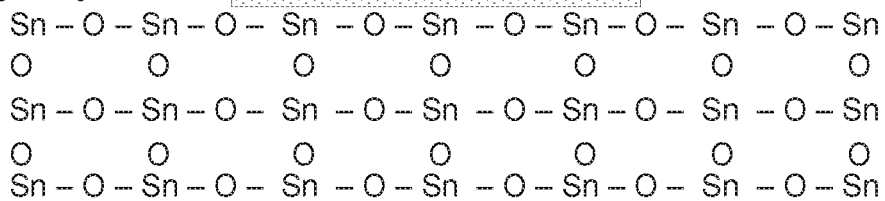
Figure 13:

In various embodiments, the deposited metal is a late transition metal, such as cobalt, nickel, copper, or mixtures thereof. Without limiting the mechanism, function or utility of present technology, it is believed that, in some embodiments, such methods may provide a simple additive patterning approach for depositing metal features on a substrate only where such features are needed, in contrast to subtractive technologies known in the art that involve blanket deposition of metal followed by patterned removal. Elements of such a process are depicted in the process flow of FIG. 12 and illustrated in FIG. 13.

Conclusion

Methods are provided for making imaging layers on the surface of a substrate that may be patterned using next generation lithographic techniques into chemically distinct regions (i.e., surface imaging). The resulting patterned film may be used, for example, as a lithographic mask for production of a semiconductor device.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein but may be modified within the scope of the disclosure and the appended claims.

What is claimed is:

1. A method of making an imaging layer on a substrate, the method comprising:
   providing a substrate having a surface comprising exposed hydroxyl groups; and
   forming a hydrocarbyl-terminated $SnO_x$ film as an imaging layer on the surface of the substrate, the hydrocarbyl-terminated SnO$_x$ film having a tin-carbon bond cleavable by irradiating the imaging layer.

2. The method of claim 1, wherein the forming the hydrocarbyl-terminated SnOx film imaging layer comprises contacting the surface of the substrate with a hydrocarbyl-substituted tin capping agent that undergoes tin-carbon bond cleavage upon the irradiating of the imaging layer.

3. The method of claim 1, wherein the hydrocarbyl-substituted tin capping agent acts as a blocking agent to prevent attachment or growth of soluble metal oxide precursors from solutions brought into contact with the surface.

4. The method of claim 2, wherein the hydrocarbyl-substituted tin capping agent is of the formula $$R_n SnX_{4-n}$$

wherein R is a $C_2$-$C_{10}$ alkyl or substituted alkyl comprising a beta-hydrogen, X is a leaving group upon reaction with a hydroxyl group of the exposed hydroxyl groups, and n=1-3.

5. The method of claim 4, wherein R is selected from the group consisting of t-butyl, t-pentyl, t-hexyl, cyclohexyl, isopropyl, isobutyl, sec-butyl, n-butyl, n-pentyl, n-hexyl, and derivatives thereof having a heteroatom substituent in the beta position.

6. The method of claim 4, wherein X is selected from the group consisting of dialkylamido, alcohol, and halogen.

7. The method of claim 2, wherein the hydrocarbyl-substituted tin capping agent is selected from the group consisting of t-butyltris(dimethylamino)tin, n-butyltris(dimethylamino)tin, t-butyltris(diethylamino)tin, isopropyltris(dimethylamino)tin, t-butyltris(t-butoxy)tin, n-butyltris(t-butoxy)tin, di(t-butyl)di(dimethylamino)tin, secbutyltris(dimethylamino)tin, n-pentyltris(dimethylamino)tin, isobutyltris(dimethylamino)tin, and isopropyltris(t-butoxy)tin.

8. The method of claim 1, wherein the substrate comprises amorphous carbon (a-C), SnO$_x$, SiO$_2$, SiO$_x$N$_y$, SiO$_x$C, Si$_3$N$_4$, TiO$_2$, TiN, W, W-doped C, WO$_x$, HfO$_2$, ZrO$_2$, Al$_2$O$_3$ or Bi$_2$O$_3$.

9. The method of claim 1, wherein the providing comprises forming a hydroxyl-terminated SnO$_x$ layer on the surface of the substrate.

10. The method of claim 9, wherein the forming comprises depositing a hydroxyl-terminated SnO$_x$ layer on the surface by vapor deposition.

11. The method of claim 10, wherein the depositing comprises reaction of Sn—X$_n$ with an oxygen-containing counter-reactant, wherein X is dialkylamido, alcohols, or halogen.

12. The method of claim 11, wherein Sn—X$_n$ is SnCl$_4$, SnI$_4$, or Sn(NR$_2$)$_4$ wherein R is methyl or ethyl, or Sn(t-BuO)$_4$.

13. The method of claim 11, wherein the oxygen-containing counter-reactant is selected from the group consisting of water, hydrogen peroxide, formic acid, alcohols, oxygen, ozone, oxygen plasma, water plasma, and combinations thereof.

14. The method of claim 10, wherein the vapor deposition is chemical vapor deposition (CVD), atomic layer deposition (ALD), plasma-enhanced chemical vapor deposition (PECVD), or plasma-enhanced atomic layer deposition (PEALD).

15. The method of claim 10, wherein the depositing is an ALD cyclical process of depositing the Sn—X$_n$ and depositing the oxygen-containing counter-reactant.

16. The method of claim 10, wherein the depositing is a CVD process comprising simultaneously depositing the Sn—X$_n$ and the oxygen-containing counter-reactant.

17. The method of claim 1, wherein the imaging layer has a thickness of from 0.5 nm to 5 nm.

18. The method of claim 1, wherein the substrate comprises underlying topographical features.

19. The method of claim 1, further comprising irradiating the imaging layer to form at least one exposed region wherein hydrocarbyl-terminated SnO$_x$ is converted to hydrogen-terminated SnO$_x$ in the exposed region.

20. The method of claim 19, wherein the irradiating comprises use of deep ultraviolet (DUV), extreme ultraviolet (EUV), X-ray, or e-beam radiation.

21. The method of claim 19, wherein a hydroxyl-terminated SnO$_x$ layer on the surface of the substrate enhances absorption of radiation upon the irradiating of the imaging layer.

22. The method of claim 1, wherein the irradiating comprises the use of EUV radiation.

23. The method of claim 6, wherein X is selected from the group consisting of dimethylamido, methylethylamido, diethylamido, t-butoxy, isopropoxy, F, Cl, Br, and I.

24. The method of claim 11, wherein X is selected from the group consisting of dimethylamido, methylethylamido, diethylamido, t-butoxy, isopropoxy, F, Cl, Br, and I.

25. A method of making a lithographic hard mask on the surface of a substrate, comprising:
providing a substrate comprising a substrate material having a surface comprising exposed hydroxyl groups;
depositing an imaging layer on the surface, the imaging layer comprising hydrocarbyl-terminated SnO$_x$;
selectively irradiating the imaging layer, such that the imaging layer comprises an irradiated region wherein a hydrocarbyl-substitution on a SnO$_x$ moiety of the hydrocarbyl-terminated imaging layer is removed and/or converted to a hydrogen-terminated SnO$_x$, and an unirradiated region wherein the imaging layer comprises the hydrocarbyl-terminated SnO$_x$; and
processing the imaging layer by reacting the irradiated region, the unirradiated region, or both, with one or more reagents to selectively add material to or remove material from the imaging layer.

26. The method of claim 25, wherein the providing comprises depositing a hydroxyl-terminated SnO$_x$ layer on the surface of the substrate material by vapor deposition.

27. The method of claim 25, wherein the depositing the imaging layer comprises contacting the surface of the substrate with a hydrocarbyl-substituted tin capping agent that undergoes tin-carbon bond cleavage upon the selectively irradiating of the imaging layer.

28. The method of claim 27, wherein the hydrocarbyl-substituted tin capping agent is of the formula $$R_n SnX_{4-n}$$

wherein R is a $C_2$-$C_{10}$ alkyl or substituted alkyl having a beta-hydrogen, X is a suitable leaving group upon reaction with a hydroxyl group of the exposed hydroxyl groups, and n=1-3.

29. The method of claim 28, wherein the hydrocarbyl-substituted tin capping agent is t-butyltris(dimethylamino)tin, n-butyltris(dimethylamino)tin, t-butyltris(diethylamino)tin, isopropyltris(dimethylamino)tin, and t-butyltris(t-butoxy)tin, or n-butyl(tris(t-butoxy)tin.

30. The method of claim 25, wherein the selectively irradiating comprises the use of DUV, EUV, X-ray or e-beam radiation.

31. The method of claim 30, wherein the irradiating comprises the use of EUV radiation.

32. The method of claim 25, wherein the hydrocarbyl-substitution on the $SnO_x$ moiety of the hydrocarbyl-terminated imaging layer is converted to a hydrogen-terminated $SnO_x$ by beta-hydride elimination.

33. The method of claim 25, wherein the processing comprises oxidizing the hydrogen-terminated $SnO_x$ in the irradiated region to form a hydroxyl-terminated $SnO_x$.

34. The method of claim 33, wherein the oxidizing comprises exposing the irradiated region to oxygen or water.

35. The method of claim 33, wherein the processing comprises removing the hydroxyl-terminated $SnO_x$ in the irradiated region to expose an underlying substrate material, and wherein the underlying substrate material comprises amorphous carbon.

36. The method of claim 35, wherein the removing comprises treating the irradiated region to dilute hydrofluoric acid or dilute aqueous tetramethylammonium hydroxide (TMAH).

37. The method of claim 35, wherein the processing further comprises etching of the underlying amorphous carbon using oxygen plasma.

38. The method of claim 33, wherein the processing further comprises depositing a metal oxide hard mask on the hydroxyl-terminated $SnO_x$ of the irradiated region.

39. The method of claim 38, wherein the metal oxide hard mask comprises a metal oxide selected from the group consisting of $SnO_x$, $SiO_2$, $SiO_xN_y$, $SiO_xC$, $TiO_2$, $WO_x$, $HfO_2$, $ZrO_2$, $Al_2O_3$ and $Bi_2O_3$.

40. The method of claim 25, further comprising selective deposition of a metal layer by atomic layer deposition solely on the hydrogen-terminated $SnO_x$ areas generated by selectively irradiating the imaging layer.

41. The method of claim 25, wherein the hydrocarbyl-terminated $SnO_x$ of the unirradiated region is removed by hydrogen or methane plasma to expose an underlying substrate material, and wherein the underlying substrate material comprises amorphous carbon.

42. The method of claim 41, wherein the processing further comprises etching of the underlying substrate material using an oxygen plasma.

* * * * *